(12) United States Patent
Tsang et al.

(10) Patent No.: US 11,192,239 B2
(45) Date of Patent: Dec. 7, 2021

(54) SUBSTRATE PROCESSING APPARATUS

(71) Applicant: Brooks Automation, Inc., Chelmsford, MA (US)

(72) Inventors: Vincent W. Tsang, Lincoln, MA (US); Robert T. Caveney, Windham, NH (US)

(73) Assignee: Brooks Automation, Inc., Clemsford, MA (US)

( * ) Notice: Subject to any disclaimer, the term of this patent is extended or adjusted under 35 U.S.C. 154(b) by 116 days.

(21) Appl. No.: 16/592,431

(22) Filed: Oct. 3, 2019

(65) Prior Publication Data

US 2020/0122316 A1 Apr. 23, 2020

Related U.S. Application Data

(60) Provisional application No. 62/742,000, filed on Oct. 5, 2018.

(51) Int. Cl.
*B25J 9/00* (2006.01)
*B65G 47/90* (2006.01)
*H01L 21/687* (2006.01)

(52) U.S. Cl.
CPC .......... *B25J 9/0087* (2013.01); *B65G 47/907* (2013.01); *H01L 21/68707* (2013.01)

(58) Field of Classification Search
None
See application file for complete search history.

(56) References Cited

U.S. PATENT DOCUMENTS

| | | | |
|---|---|---|---|
| 5,064,340 A | 11/1991 | Genov et al. | |
| 6,261,048 B1 | 7/2001 | Muka | |
| 6,293,746 B1 | 9/2001 | Ogawa et al. | |
| 6,428,266 B1 * | 8/2002 | Solomon | B25J 9/042 414/744.1 |
| 6,655,901 B2 | 12/2003 | Tsubota et al. | |
| 9,076,829 B2 * | 7/2015 | Brodine | B25J 9/042 |
| 2007/0274810 A1 | 11/2007 | Holtkamp et al. | |
| 2008/0298945 A1 | 12/2008 | Cox et al. | |
| 2009/0087288 A1 | 4/2009 | Hofmeister et al. | |
| 2011/0135437 A1 | 6/2011 | Takeshita et al. | |

(Continued)

OTHER PUBLICATIONS

International Search Report, International Application No. PCT/US2019/034908, dated Aug. 8, 2019.

*Primary Examiner* — Ronald P Jarrett
(74) *Attorney, Agent, or Firm* — Perman & Green, LLP; Colin C. Durham

(57) ABSTRACT

A substrate processing apparatus including a frame, a SCARA arm mounted to the frame at a shoulder joint having two links with at least one end effector dependent therefrom, the links defining an upper arm and a forearm, each end effector pivotally joined to the forearm at a wrist to rotate about a wrist axis, and a drive section with at least one degree of freedom operably coupled to the arm to rotate the arm about a shoulder axis articulating extension and retraction, wherein the end effector is coupled to a wrist joint pulley so that extension and retraction effects rotation of the pulley and end effector as a unit about the wrist axis, and wherein a height of the end effector is within a stack height profile of the wrist joint so that a total stack height is sized to conform with and pass through a pass-through of a slot valve.

30 Claims, 26 Drawing Sheets

(56) References Cited

U.S. PATENT DOCUMENTS

| | | |
|---|---|---|
| 2012/0141235 A1 | 6/2012 | Krupyshev et al. |
| 2012/0189419 A1* | 7/2012 | Yazawa .................... B25J 9/042 414/744.2 |
| 2012/0232690 A1* | 9/2012 | Gilchrist .................. B25J 9/043 700/228 |
| 2014/0199138 A1 | 7/2014 | Van Der Meulen et al. |
| 2015/0128749 A1 | 5/2015 | Gilchrist |
| 2018/0019155 A1 | 1/2018 | Tsang et al. |

* cited by examiner

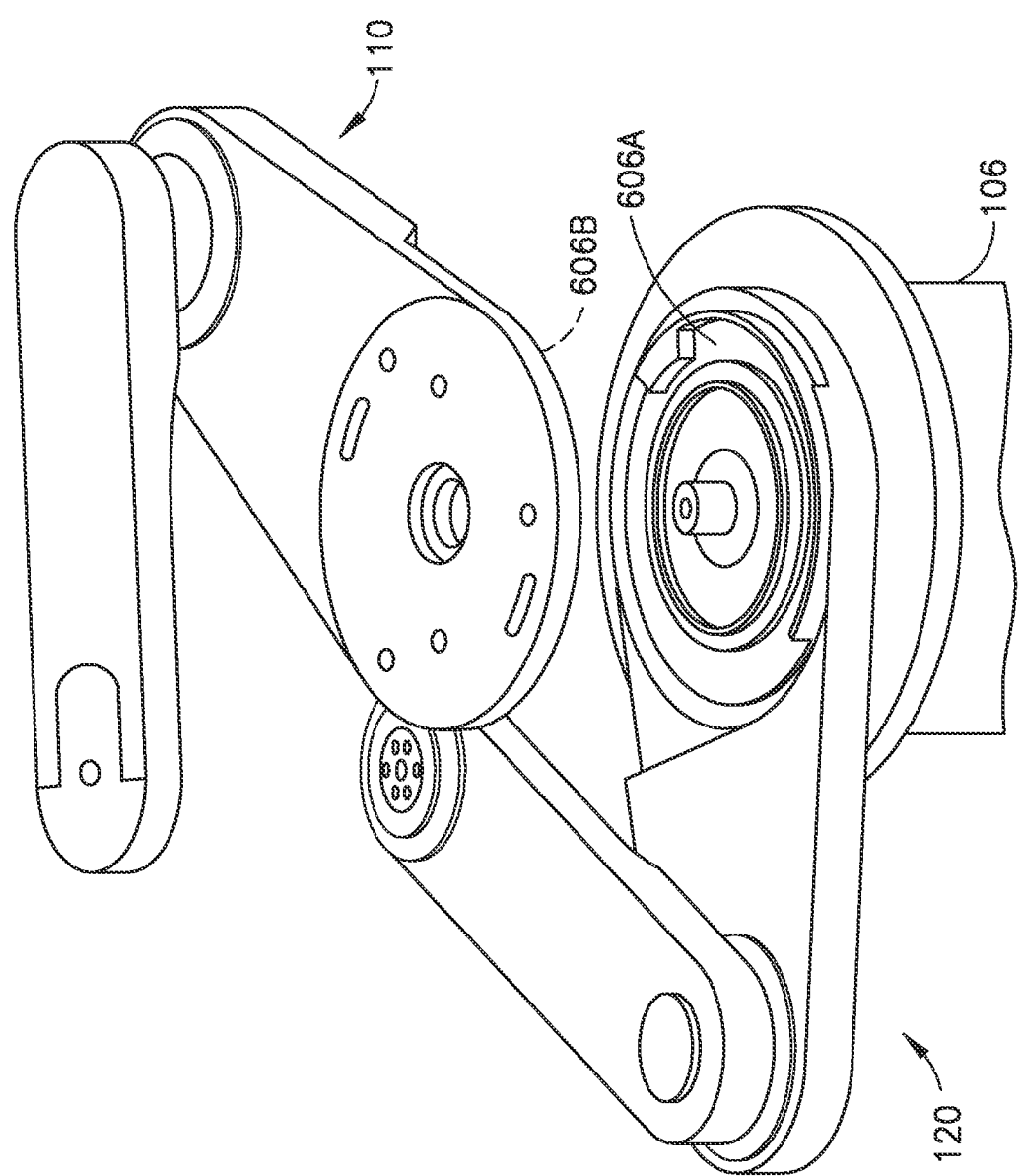

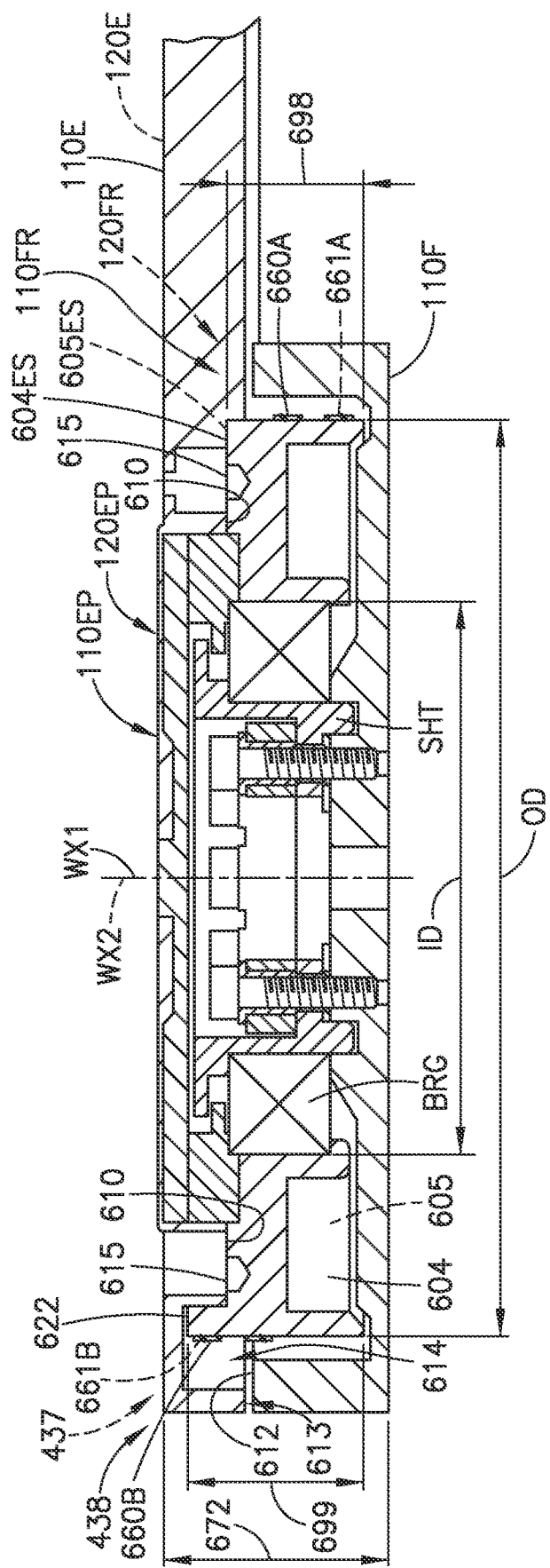

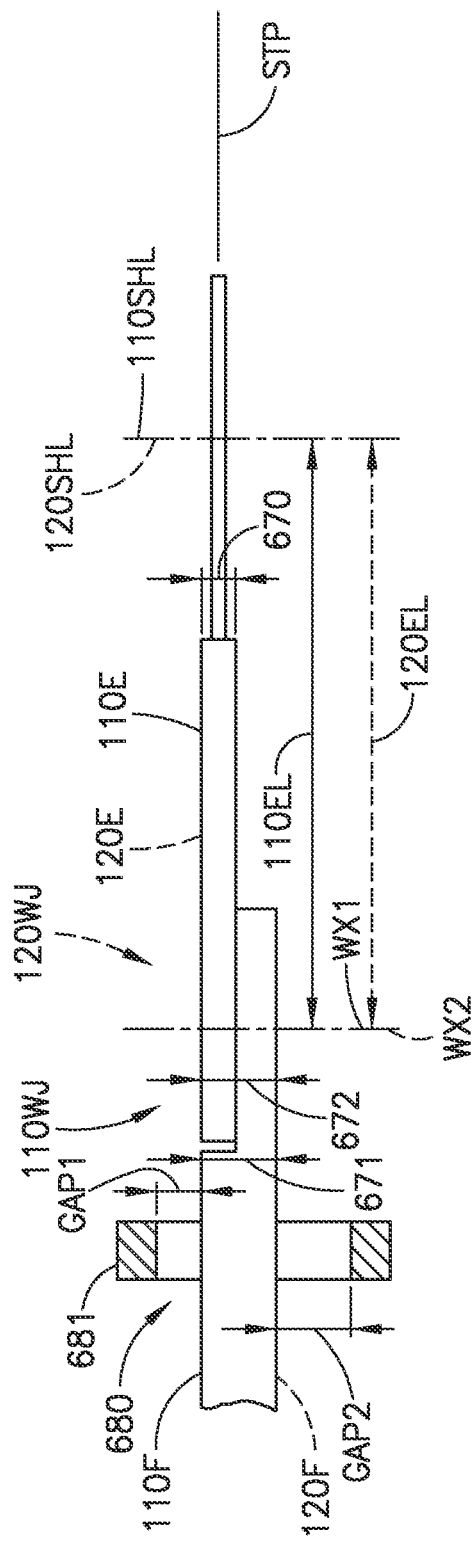
FIG. 6G
FIG. 6I
FIG. 6H

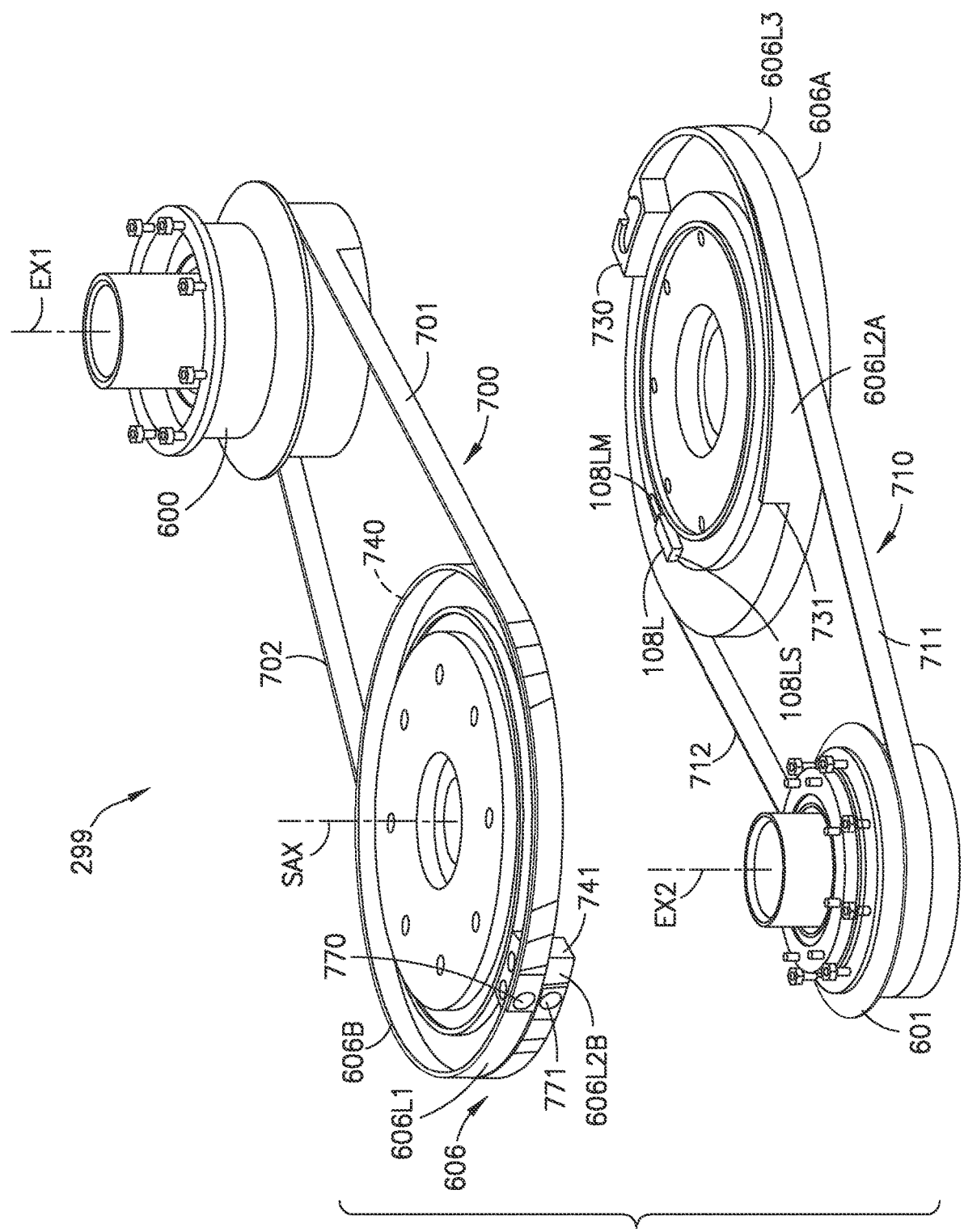

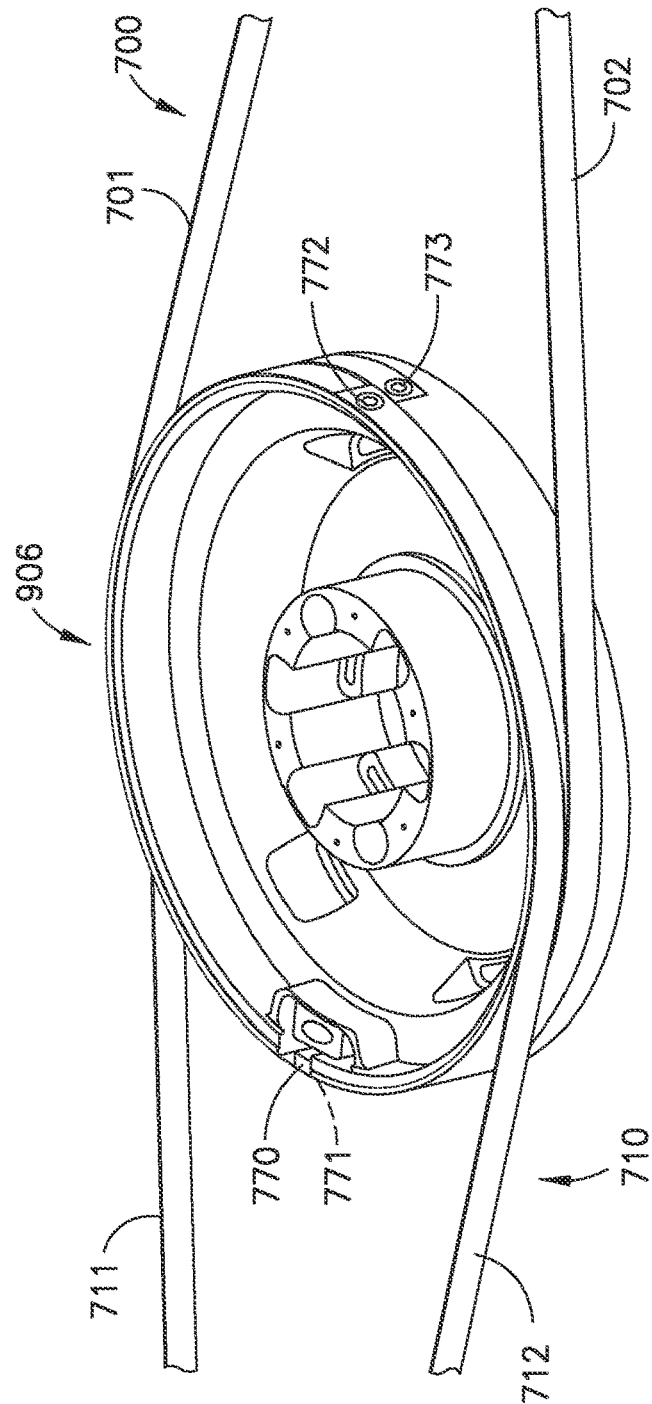
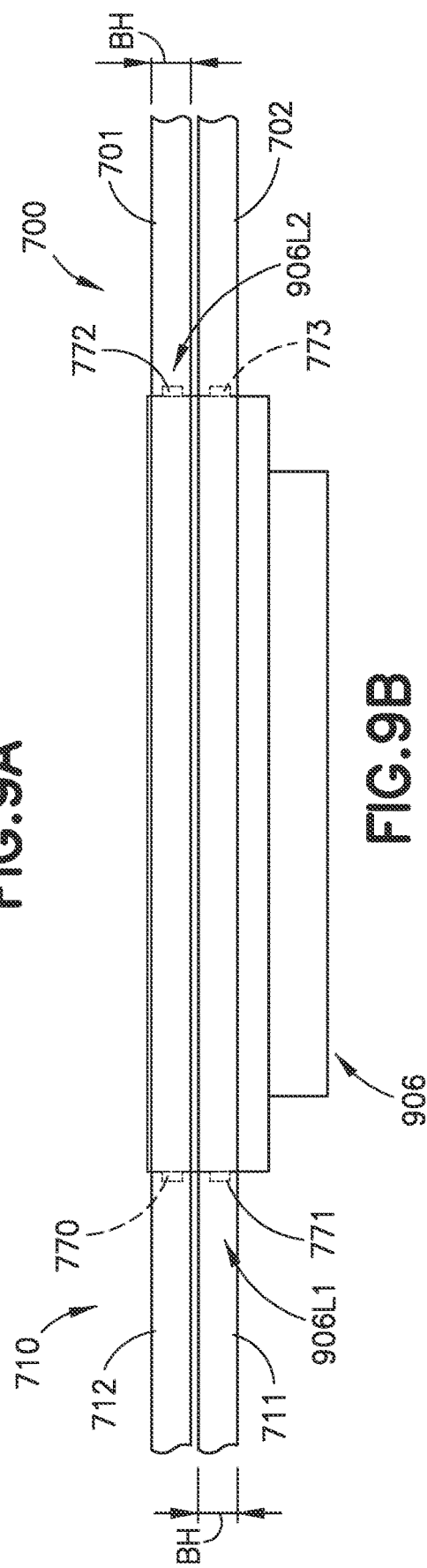
FIG. 9A
FIG. 9B

SUBSTRATE PROCESSING APPARATUS

CROSS REFERENCE TO RELATED APPLICATION

This Non-Provisional patent application claims priority to and the benefit of U.S. Provisional Patent Application No. 62/742,000, filed Oct. 5, 2018, the disclosure of which is incorporated herein by reference in its entirety.

BACKGROUND

1. Field

The exemplary embodiments generally relate to substrate processing tools, more particularly, to substrate transport apparatus.

2. Brief Description of Related Developments

In semiconductor processing dual SCARA (selective compliant articulated robot arm) arm robot may be used to transfer wafers to and from a semiconductor process module. The dual SCARA arm robot generally allows for a fast swapping of substrates from and to the process module where a fast swap may be referred to as the removal of one substrate from the process module and the placement another different substrate to the same process module in rapid succession without rotating the dual SCARA arm robot as a unit about the shoulder axis of the dual SCARA arm robot and substantially without retracting the arm to a battery position or a fully retracted position.

Generally each arm of the dual SCARA arm robot includes an upper arm rotatable about a shoulder axis, a forearm rotatably coupled to the upper arm about an elbow axis and an end effector or substrate holder coupled to the forearm about a wrist axis. Generally, referring to FIGS. 8A and 8B, a wrist pulley 800 is disposed at each wrist axis 850 for driving rotation of a respective end effector 811, 812 coupled thereto. Here the wrist pulley 800 and the respective end effector 811, 812 rotate about the wrist axis 850 as a unit (e.g., the wrist pulley 800 rotates in unison with the respective end effector 811, 812). The wrist pulley is driven by a transmission loop 803 that is comprised of two bands 801, 802 that are wrapped around wrist pulley 800 so as to cover an arc that spans about 180 degrees relative to an axis of rotation of the wrist pulley 800. Here, the bands 801, 802 must be stacked one above the other on the wrist pulley 800 thereby defining a height PH of the wrist pulley 800 as being at least twice the height BH of a single band 801, 802. The wrist pulley 800 is generally located within a respective forearm 820, 821 and is coupled to the respective end effector 811, 812 by a shaft so that the respective end effector 811, 812 rotates above (or below) the respective forearm 820, 821. As such, in the case of, for example, a single arm of a conventional SCARA arm robot a height WJH of the wrist joint 830 would be at least twice the height BH of a single band 801, 802, plus the thickness of a wrist plate 811P, 812P of the respective end effector 811, 812 plus twice a wall thickness of the respective forearm 820, 821.

The substrate transport robots generally operate within a transport chamber where the transport chamber internal height accommodates the height of, for example, the dual SCARA arm of the transport robot, the Z-travel range of the arm in addition to the required operational clearance between the arms and the walls of the transport chamber. The transport chambers typically include slot valves that have openings sized to allow passage of the end effector and/or wrist joint through the slot valve opening. In some instances the slot valve opening is not large enough for the wrist joint to pass through which leads to long end effector pan offsets that provide reach of the respective SCARA arm while keeping the wrist joint from passing through the slot valve opening. However, increasing the pan offset of the end effector reduces end effector stiffness and increases the swing diameter of the SCARA arm.

BRIEF DESCRIPTION OF THE DRAWINGS

The foregoing aspects and other features of the disclosed embodiment are explained in the following description, taken in connection with the accompanying drawings, wherein:

FIGS. 6A and 6B are schematic illustrations of portions of a substrate transport apparatus in accordance with one or more aspects of the disclosed embodiment;

FIG. 6F is a schematic cross-sectional illustration of a transfer arm wrist joint in accordance with one or more aspects of the disclosed embodiment;

FIG. 6G is a schematic illustration of the wrist joint of FIG. 6F extending through a slot valve in accordance with one or more aspects of the disclosed embodiment;

FIGS. 6H and 6I are schematic illustrations of a portion of respective transfer arm end effectors in accordance with one or more aspects of the disclosed embodiment;

FIGS. 7A-7H are schematic illustrations of portions of a substrate transport apparatus in accordance with one or more aspects of the disclosed embodiment;

FIGS. 9A and 9B are schematic illustrations of portions of a substrate transport apparatus in accordance with one or more aspects of the disclosed embodiment;

DETAILED DESCRIPTION

It would be advantageous to have a reduced height wrist joint so that the wrist joint is able to pass through an opening in a slot valve and so that the internal height of the transport chamber is decreased, thereby decreasing the internal volume of the transport chamber, and/or its respective process modules. Providing for passage of the wrist joint through the slot valve opening provides for shorter end effector pan offsets that increase end effector stiffness and reduce the swing diameter of the substrate transport robot arm(s). Decreasing the swing diameter of the substrate transport arm(s) provides for decreasing the internal volume of the transfer chamber which may increase throughput of a semiconductor processing system as the time it takes to pump down the chamber to vacuum and/or evacuate the chamber to atmospheric pressure is decreased. In addition, decreasing the overall height of the transport chamber decreases the cost of the transport chamber. The aspects of the present disclosure, as will be described herein, among other things provides for a reduction in transfer arm wrist joint height by reducing an amount of wrist pulley band/cable wrap. The reduction in height of the transfer arm wrist joint may provide for the passage of at least part of the wrist joint through the slot valve opening which may effect the advantages noted above.

Figure 1:
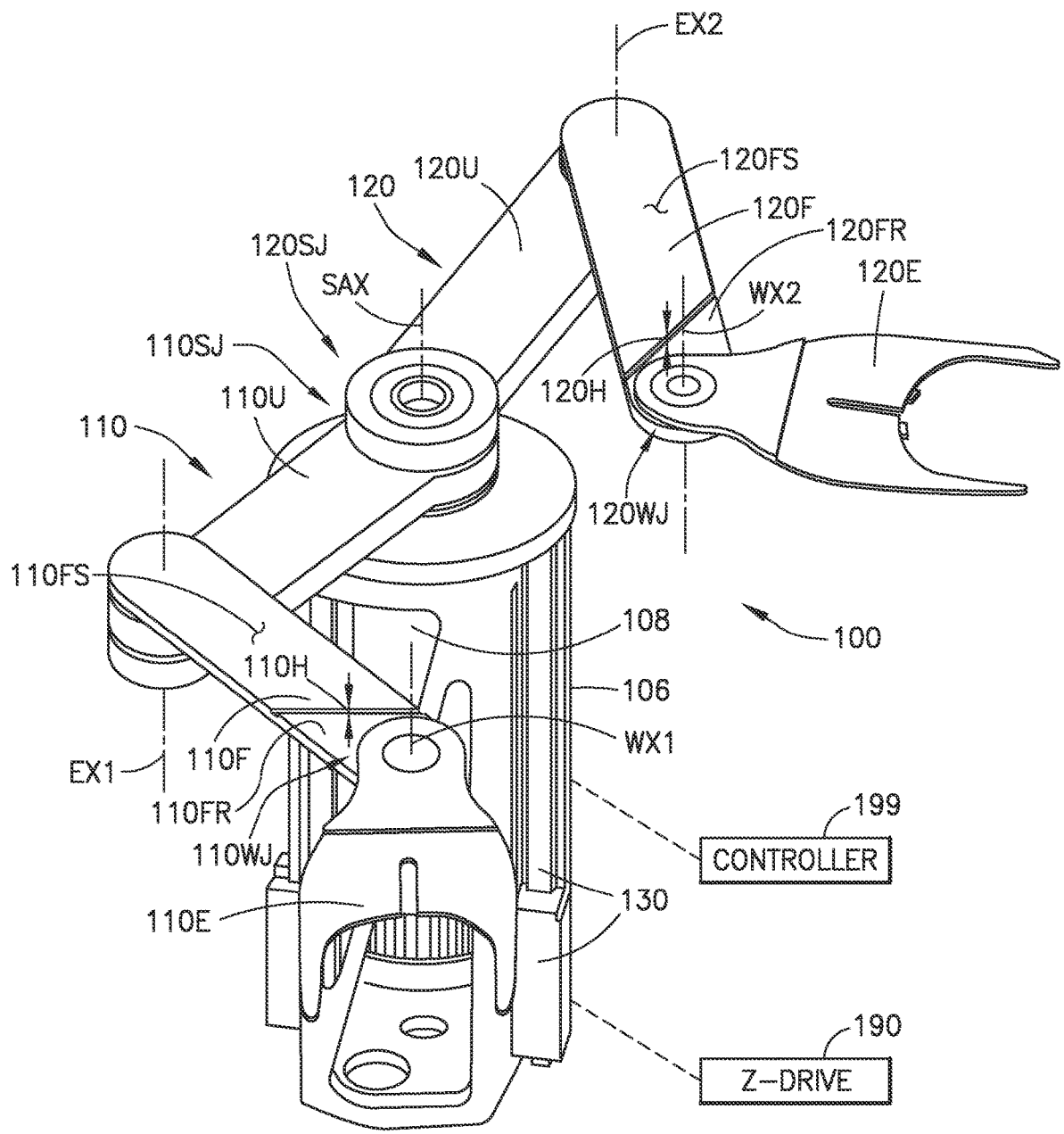
FIG. 1 is a schematic illustration of a substrate transport apparatus in accordance with one or more aspects of the disclosed embodiment.

FIG. 1 illustrates a dual SCARA arm substrate processing apparatus 100 (also referred to herein as the "transport apparatus 100") in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

In one aspect the transport apparatus 100 includes a carriage or frame 106, a SCARA arm 110, 120 pivotally mounted to the frame at a shoulder joint of the SCARA arm, and a drive section 108 mounted to the frame and coupled to the SCARA arm 110, 120. In one aspect, the transport apparatus 100 includes at least two SCARA arms 110, 120. Any suitable controller 199 is connected to the drive section 108 and includes any suitable program code for effecting operation of the transport apparatus 100 as described herein.

In one aspect the at least two SCARA arms include a first SCARA arm 110 connected to the frame 106 and a second SCARA arm 120 connected to the frame 106. The first SCARA arm 110 is a two link arm with at least one end effector 110E dependent therefrom. For example, the two links of the first SCARA arm 110 define an upper arm link 110U and a forearm link 110F. The upper arm link 110U includes and determines a shoulder joint 110SJ where, the upper arm link 110U is rotatably connected at a proximate end of the upper arm link 110U (e.g., at the shoulder joint 110SJ) to the frame 106 about a shoulder axis of rotation SAX. The forearm link 110F is rotatably (e.g., pivotally) connected at a proximate end of the forearm link 110F to a distal end of the upper arm link 110U so as to define an elbow axis of rotation EX1. Each of the at least one end effector 110E is rotatably (e.g., pivotally) coupled to a distal end of the forearm link 110F at a wrist joint 110WJ about a wrist axis of rotation WX1 to rotate relative to the forearm 110F about the wrist axis of rotation WX1.

The second SCARA arm 120 is a two link arm with at least one end effector 120E dependent therefrom. For example, the two links of the second SCARA arm 120 define an upper arm link 120U and a forearm link 120F. The upper arm link 120U includes and determines a shoulder joint 120SJ where, the upper arm link 120U is rotatably connected at a proximate end of the upper arm link 120U (e.g., at the should joint 120SJ) to the frame 106 about the shoulder axis of rotation SAX. The forearm link 120F is rotatably (e.g., pivotally) connected at a proximate end of the forearm link 120F to a distal end of the upper arm link 120U so as to define an elbow axis of rotation EX2. Each of the at least one end effector 120E is rotatably (e.g., pivotally) coupled to a distal end of the forearm link 120F at a wrist joint 120WJ about a wrist axis of rotation WX2 to rotate relative to the forearm 120F about the wrist axis of rotation WX2.

While only a single end effector 110E, 120E is illustrated as being coupled to each wrist axis of rotation WX1, WX2, in other aspects any suitable number of end effectors may be coupled to one or more of the wrist axes WX1, WX2 to effect batch transfers of substrates or fast swapping of substrates. In this aspect, the shoulder axis of rotation SAX is common to both the first and second SCARA arms 110, 120 while in other aspects, the first and second SCARA arms 110, 120 may have respective shoulder axes of rotation that are arranged side by side. Further, while the aspects of the present disclosure are described with respect to a SCARA type transfer arm, the aspects of the present disclosure are equally applicable to any suitable type of transfer arm having slaved end effector(s) or end effectors that are driven by a respective drive axis, where the rotation of the end effector from arc end to arc end is about 180° or less. In other aspects, the rotation of the end effector from arc end to arc end may be more than about 180° where a surface area of an end effector interface seating surface 604ES, 605ES (see FIGS. 6D and 6E) of the transfer arm wrist idler pulley 604, 605 is reduced but is still sufficient in surface area to support the end effector 110E, 120E thereon.

Figure 2:
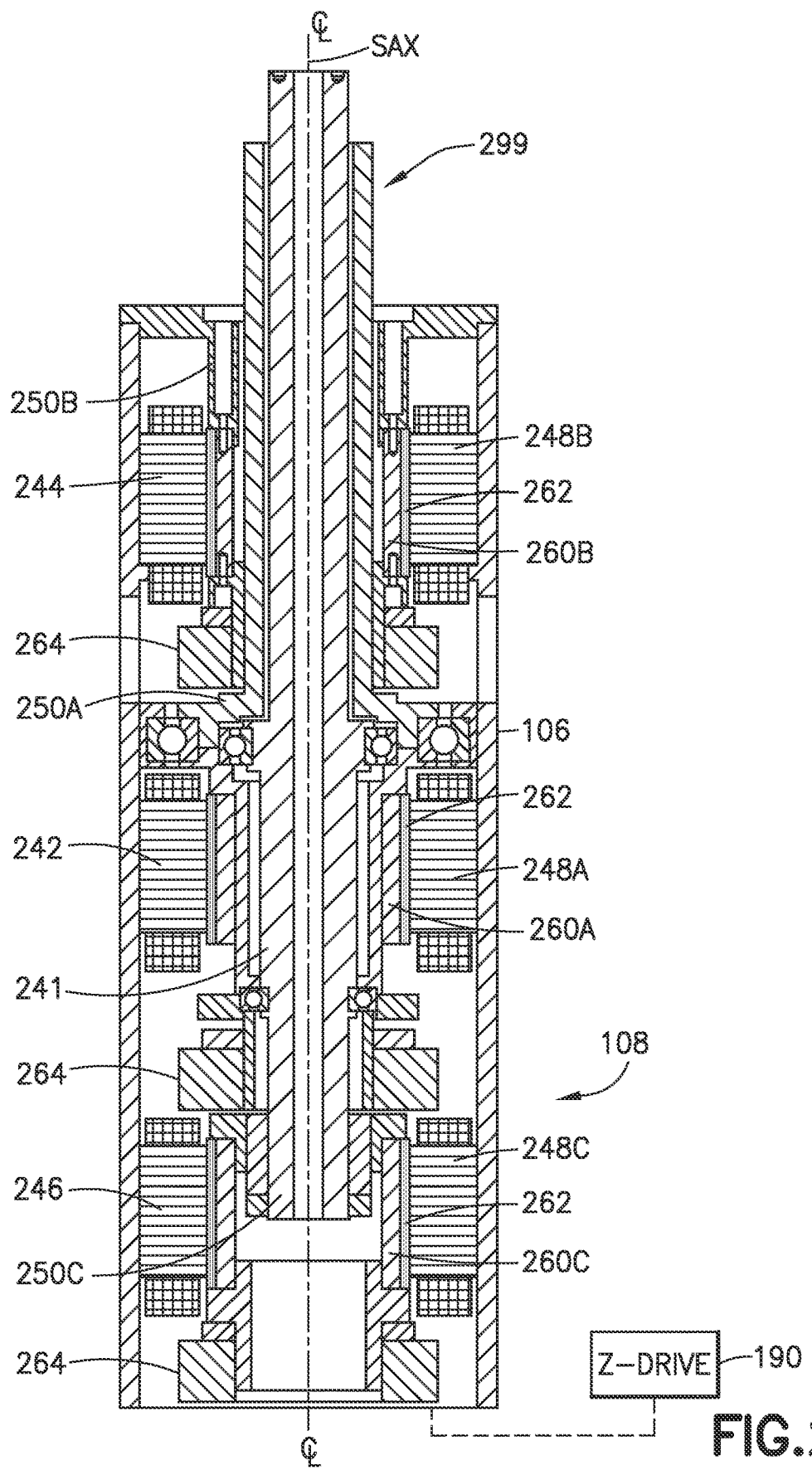
FIG. 2 is a schematic illustration of a portion of a substrate transport apparatus in accordance with one or more aspects of the disclosed embodiment.
Figure 3A:
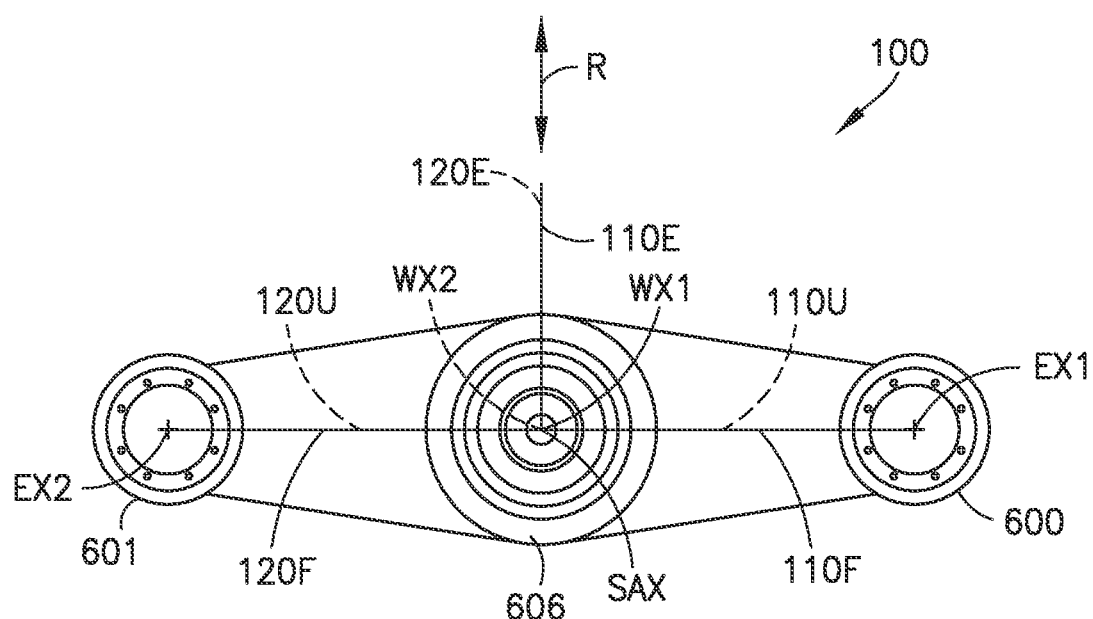
FIGS. 3A and 3B are schematic illustrations of a portion of the substrate transport apparatus of FIG. 1 in accordance with one or more aspects of the disclosed embodiment.
Figure 3B:
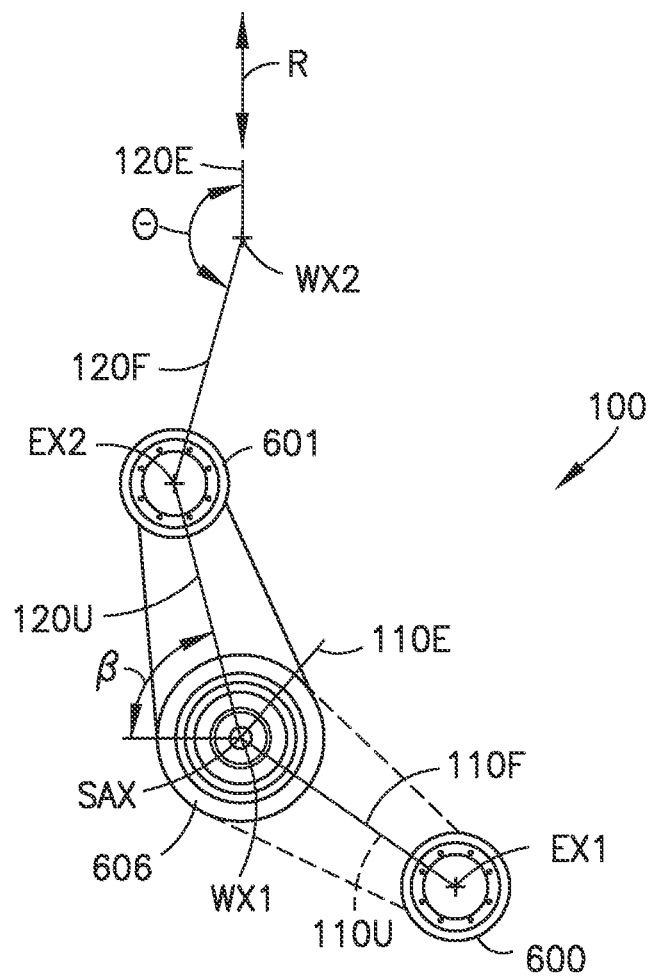
Figure 7B:
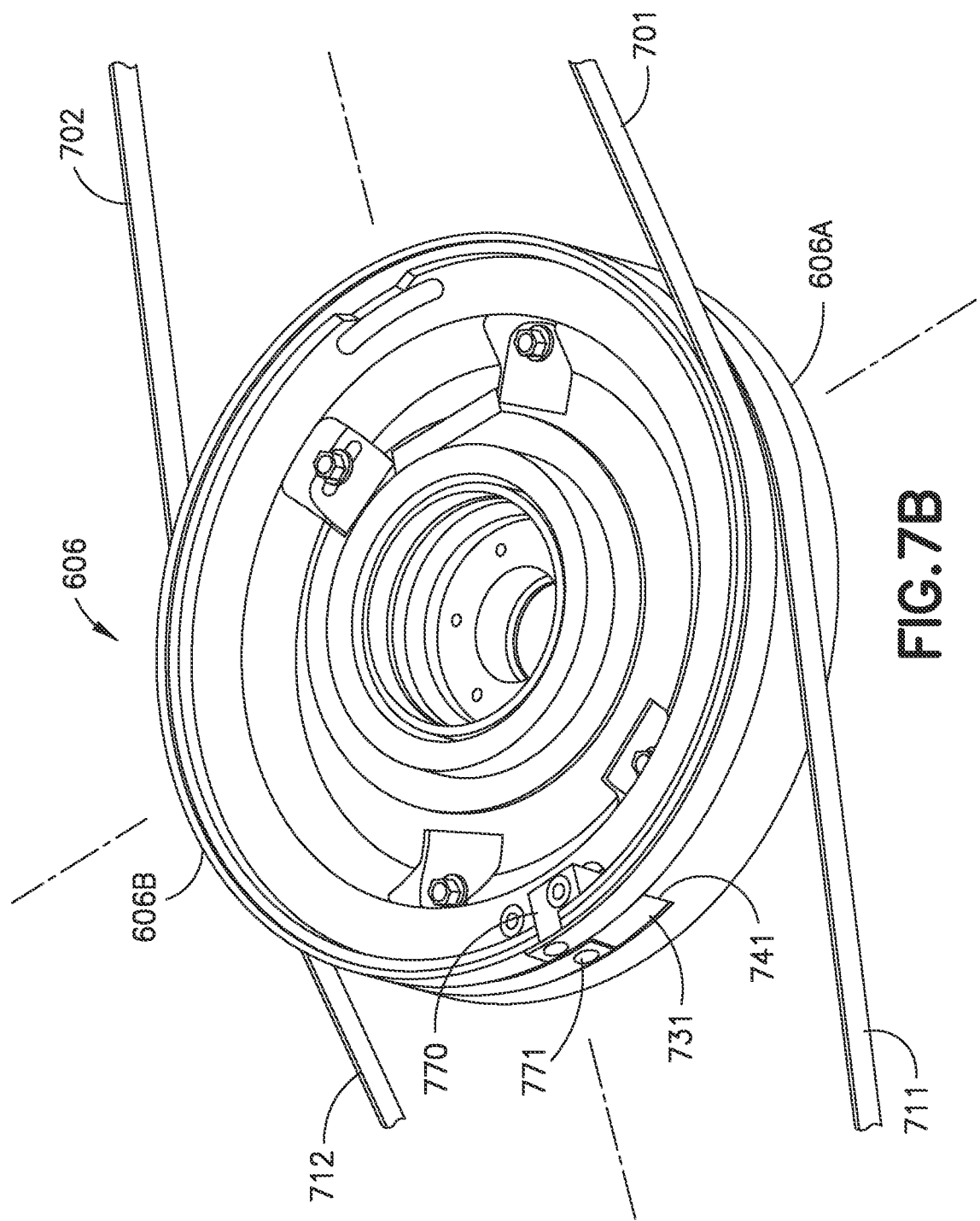
Figure 7C:
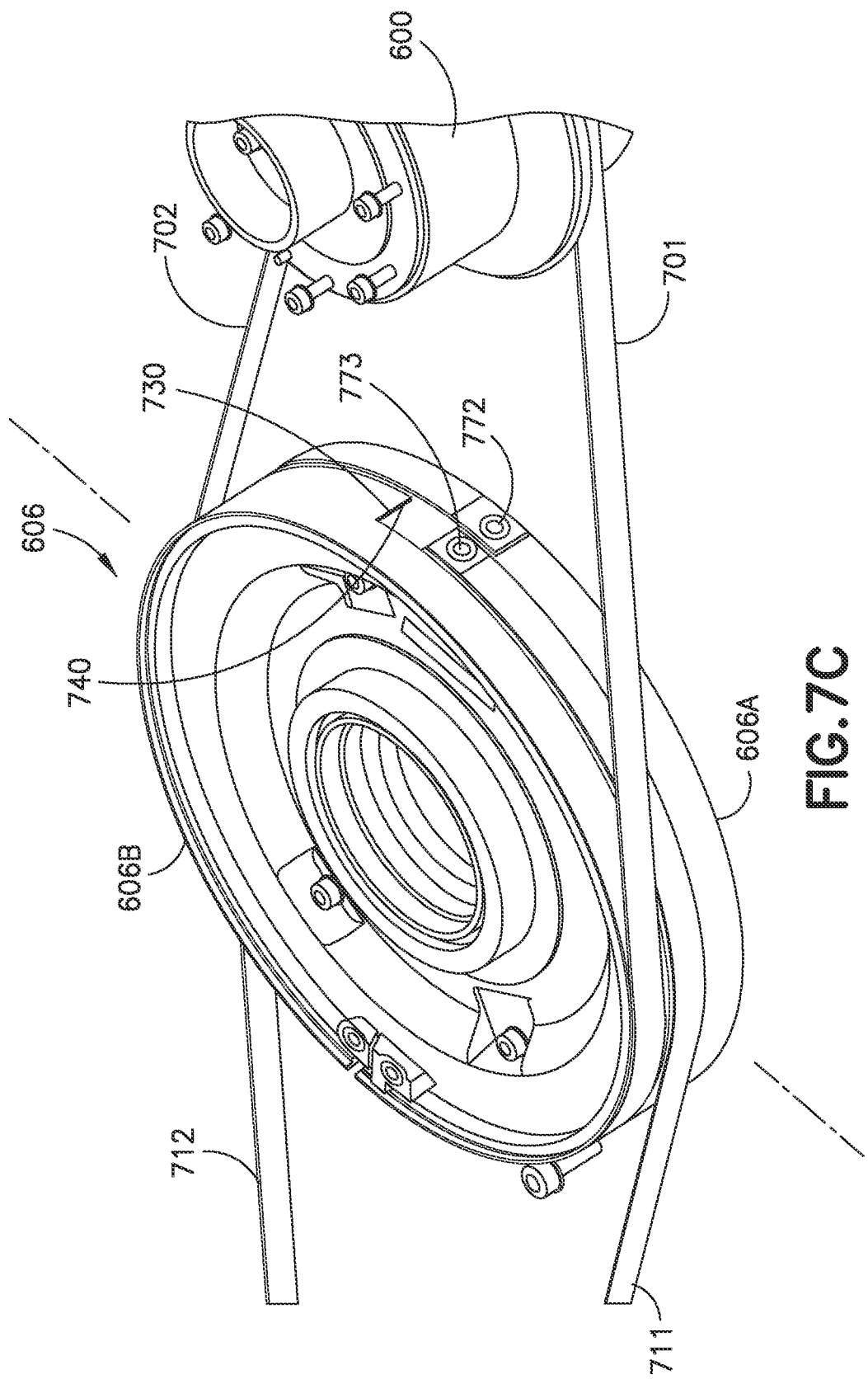
Figure 7D:
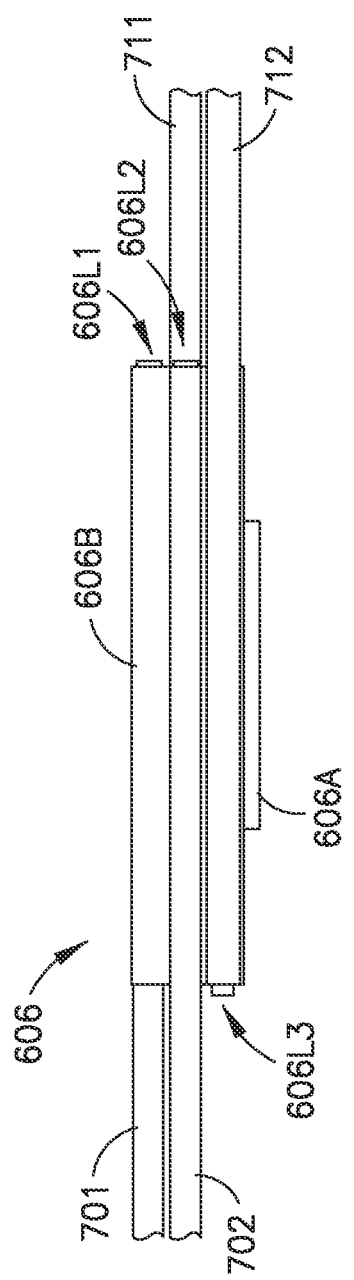
Figure 7F:
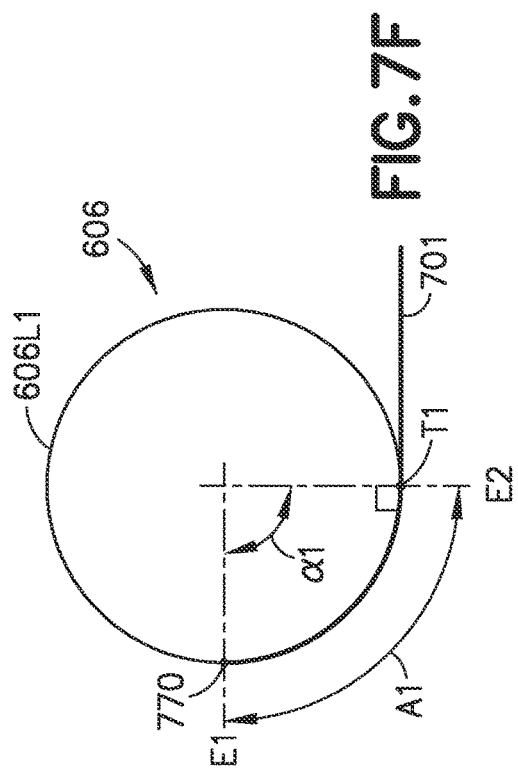
Figure 7H:
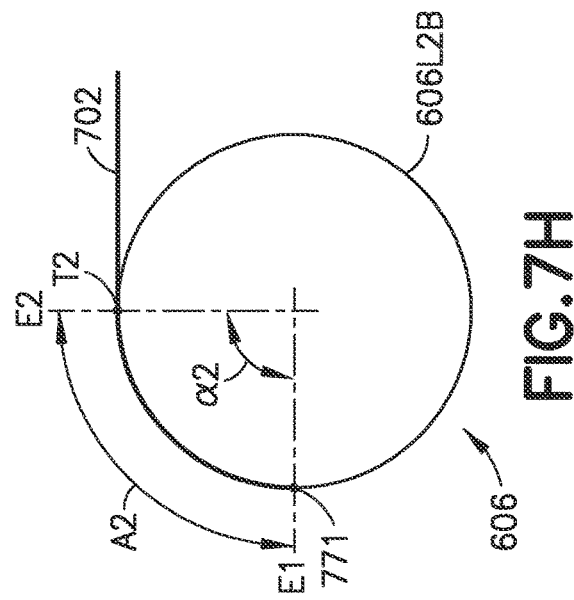
Figure 7E:
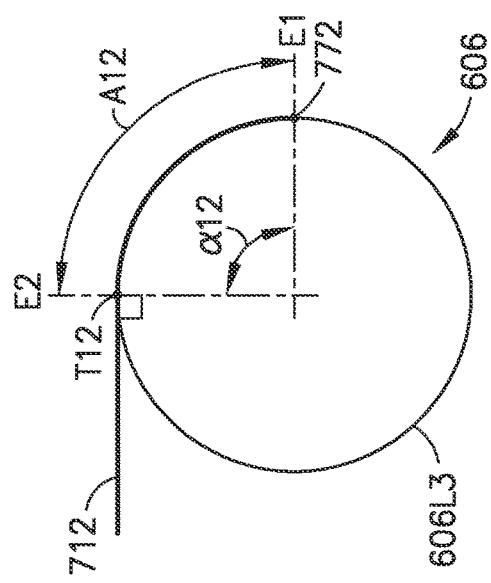
Figure 7G:
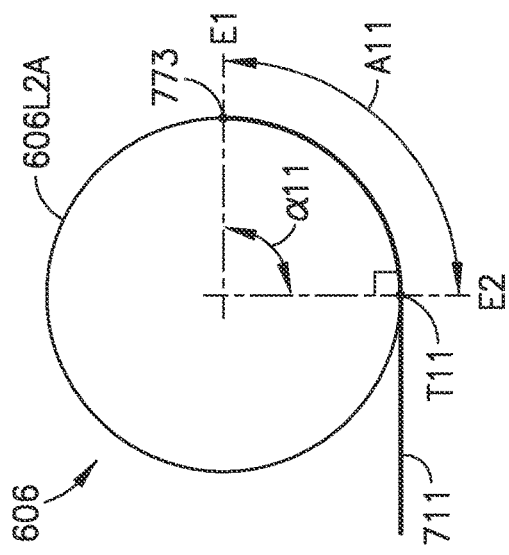

Referring also to FIGS. 2, 3A and 3B, in one aspect, the drive section 108 is mounted to the frame 106 in any suitable manner. The drive section 108 has at least one degree of freedom operably coupled via a transmission 299 (see FIGS. 2 and 7A) to the SCARA arms 110, 120 to rotate the SCARA arms 110, 120 about the shoulder axis of rotation SAX at the respective shoulder joints 110SJ, 120SJ and to articulate each of the SCARA arms 110, 120 in extension and retraction. In one aspect, the drive section 108 is a three axis (e.g. three degree of freedom) drive section while in other aspects the drive section may include any suitable number of drive axes (e.g., more or less than three drive axes). In one aspect, the drive section 108 generally comprises a drive shaft assembly 241 (which may be part of the transmission 299 along with any suitable pulley/band system as described herein) and three motors 242, 244, 246. In this aspect, the drive shaft assembly 241 has three drive shafts 250A, 250B, 250C. As may be realized the drive system may not be limited to three motors and three drive shafts.

The first motor 242 comprises a stator 248A and a rotor 260A connected to the middle shaft 250A. The second motor 244 comprises a stator 248B and a rotor 260B connected to the outer shaft 250B. The third motor 246 comprises a stator 248C and rotor 260C connected to the inner shaft 250C. The three stators 248A, 248B, 248C are stationarily attached to the frame 106 at different vertical heights or locations along the frame 106 (it is noted that a three axis drive system including radially nested motors such as those described in U.S. patent application Ser. No. 13/293,717 filed on Nov. 10, 2011 and U.S. Pat. No. 8,008,884 issued on Aug. 30, 2011, the disclosures of which are incorporated herein by reference in their entireties, may also be used to drive the transport apparatus 100). For illustrative purposes only, the first stator 248A is the middle stator, the second stator 248B is the top stator and the third stator 248C is the bottom stator. Each stator generally comprises an electromagnetic coil.

The three drive shafts 250A, 250B, and 250C are arranged as coaxial drive shafts. The three rotors 260A, 260B, 260C are preferably comprised of permanent magnets, but may alternatively comprise a magnetic induction rotor that does not have permanent magnets. Sleeves or thin can seals 262 are preferably located between the rotors 260A, 260B, 260C and the respective stators 248A, 248B, 248C to seal the stators 248A, 248B, 248C from an operational environment of the SCARA arms 110, 120 and to allow the transport apparatus 100 to be useable in a vacuum environment with the drive shaft assembly 241 being located in a vacuum environment and the stators 248A, 248B, 248C being located outside of the vacuum environment. However, the sleeves 262 need not be provided if the transport apparatus 100 is only intended for use in an atmospheric environment.

The third shaft 250C is the inner shaft and extends from the bottom stator 248C. The inner shaft 250C has the third rotor 260C aligned with the bottom stator 248C. The middle shaft 250A extends upward from the middle stator 248A. The middle shaft has the first rotor 260A aligned with the first stator 248A. The outer shaft 250B extends upward from the top stator 248B. The outer shaft has the second rotor 260B aligned with the upper stator 248B. Various bearings are provided about the shafts 250A-250C and the frame 106 to allow each shaft to be independently rotatable relative to each other and the frame 106.

In one aspect, each shaft 250A-250C may be provided with a position sensor 264. The position sensors 264 are used to signal the controller 199 of the rotational position of the shafts 250A-250C relative to each other and/or relative to the frame 106. Any suitable sensor could be used, such as optical or induction.

The drive section 108 may also include one or more suitable Z-axis drives 190 for moving the upper arm links 110U, 120U, the forearm links 110F, 120F and end effectors 110E, 120E of the transport apparatus 100 in a direction substantially parallel with (e.g. along) the shoulder axis of rotation SAX as a unit. In another aspect one or more revolute joints (such as the wrist or elbow axes) of the transport apparatus 100 may include a Z-axis drive to, for example, move the end effector(s) of each arm in the Z-direction independently of each other.

In one aspect, the outer shaft 250B is coupled to upper arm link 110U so that the outer shaft 250B and the upper arm link 110U rotate as a unit about the shoulder axis of rotation SAX. The middle shaft 250A is coupled to the upper arm link 120U so that the middle shaft 250A and the upper arm link 120U rotate as a unit about the shoulder axis of rotation SAX. In other aspects, the outer shaft 250B may be coupled to upper arm link 120U and the middle shaft 250A may be coupled to upper arm link 110U. The inner shaft 120C is connected to each of the forearm links 110F, 120F so as to commonly drive each forearm link 110F, 120F.

Figure 4:
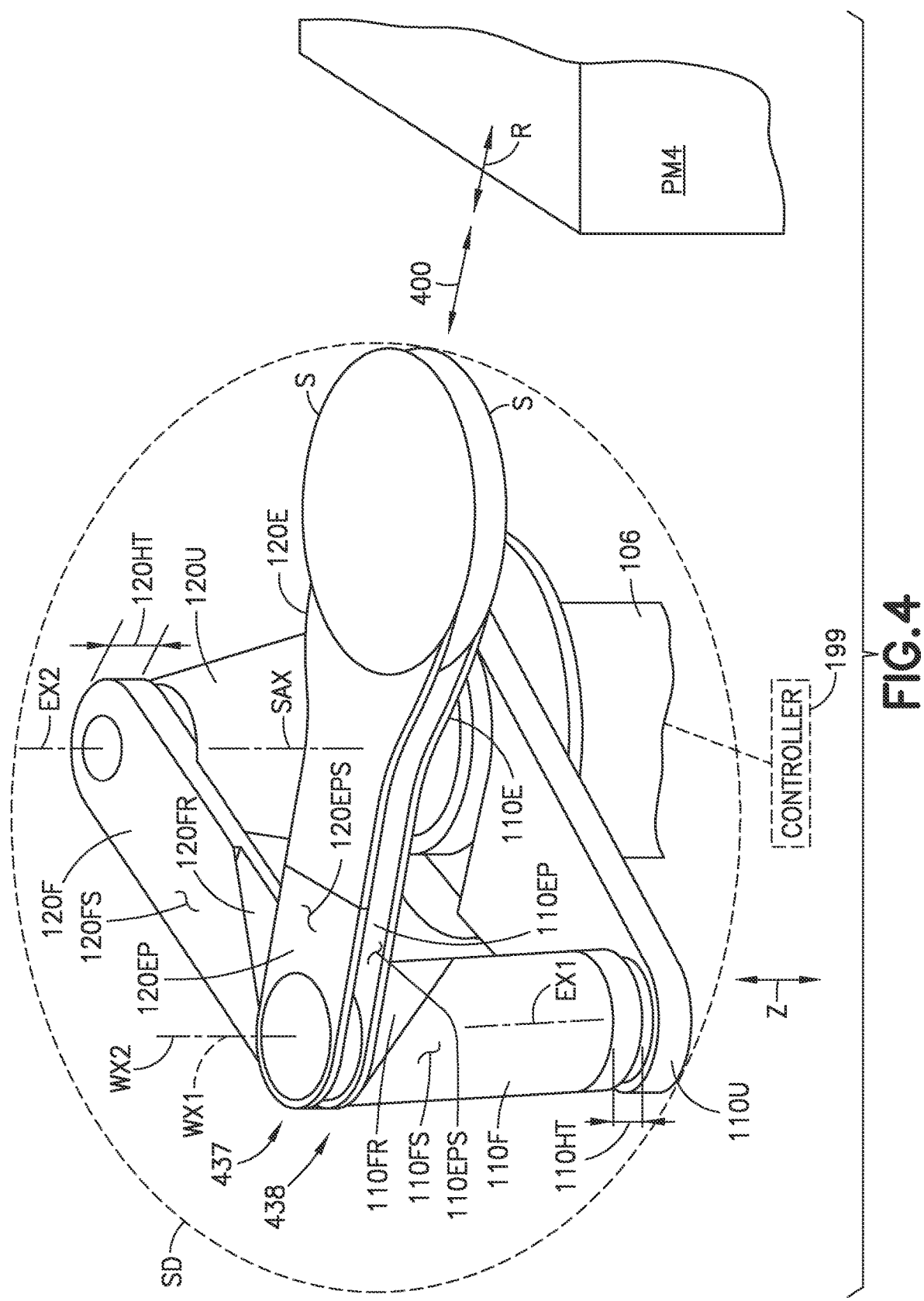
FIG. 4 is a schematic illustration of a substrate transport apparatus in accordance with one or more aspects of the disclosed embodiment.

In one aspect, as illustrated in FIGS. 1, 3A and 3B the upper arm links 110U, 120U and forearm links 110F, 120F may have substantially equal lengths while in other aspects, the upper arm links 110U, 120U and forearm links 110F, 120F may have unequal lengths. In another aspect, the end effectors 110E, 120E may have a predetermined length so that the upper arm links 110U, 120U and the forearm links 110F, 120F are swept in a direction opposite the direction of extension 400 of the end effector 110E, 120E (e.g. the wrist axes of rotation WX1, WX2 and the elbow axes of rotation EX1, EX2 are located behind the shoulder axis of rotation SAX) when the first and second SCARA arms 110, 120 are in a retracted configuration as illustrated in FIG. 4. In the aspects, illustrated in FIGS. 1, 3A, 3B and 4 the end effectors 110E, 120E are stacked one above the other over the shoulder axis SAX defining different transfer planes so that one end effector 110E, 120E passes over the other end effector 110E, 120E and each SCARA arm 110, 120 has independent extension and retraction along an extension axis R (see FIGS. 3A, 3B and 4) that is common to both SCARA arms 110, 120 and that passes over the shoulder axis of rotation SAX. In other aspects, referring also to FIGS. 5A-5G, the end effectors 110E, 120E may be located on the same plane (e.g. do not pass one over the other) where an axis of extension and retraction 400R of each of the first and second SCARA arms 110, 120 are angled relative to one another where the angle between the axes of extension and retraction 400R corresponds to an angle between process modules PM1-PM4 coupled to the transfer chamber 5020 in which the SCARA arms 110, 120 are located.

Figure 6A:
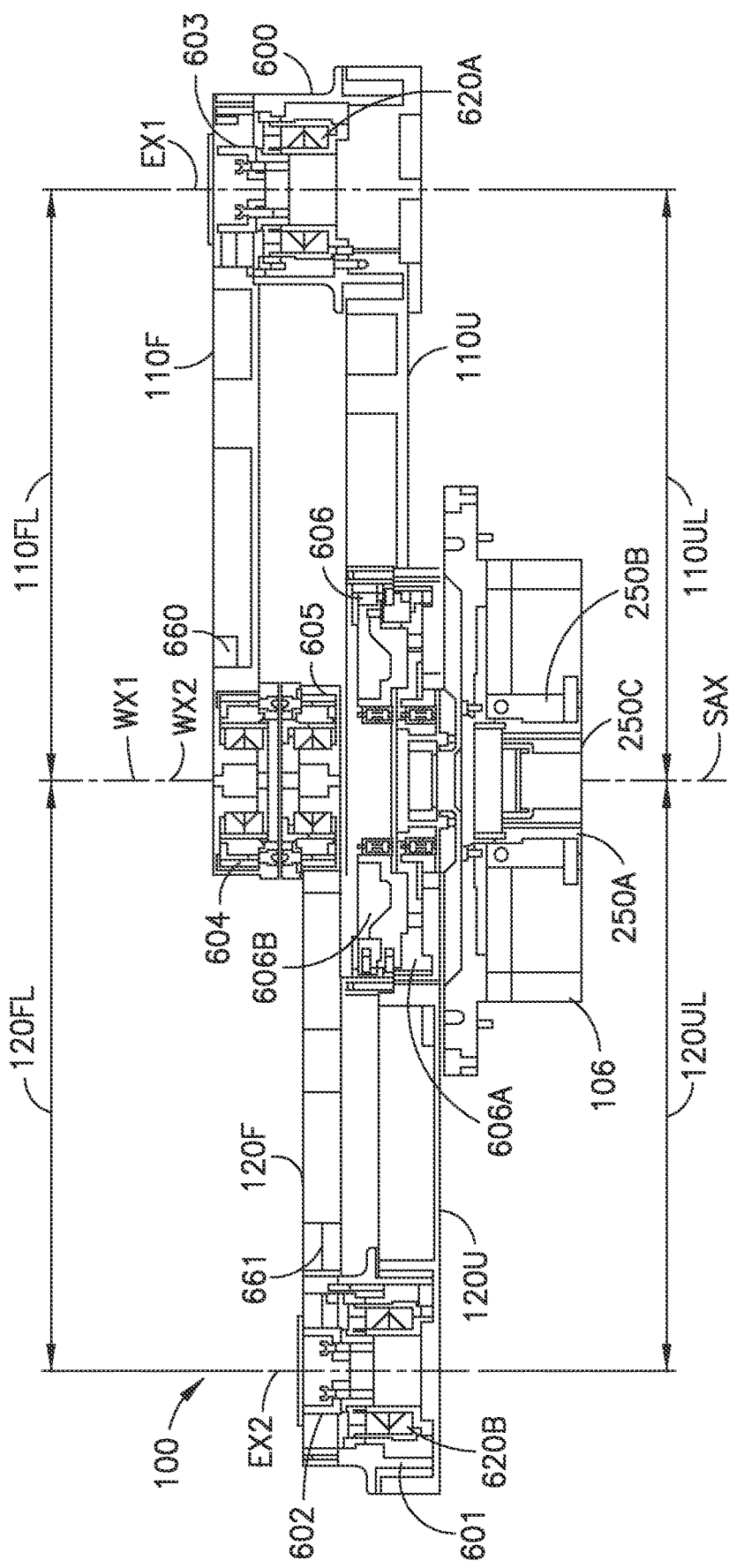

Referring now to FIG. 6A, the transport apparatus 100 will be described in additional detail. As described above, in one aspect, the outer drive shaft 250B is coupled to the upper arm link 120U and the middle drive shaft 250A is coupled to the upper arm link 110U so that each upper arm link 110U, 120U independently rotates about the shoulder axis of rotation SAX under the motive power of the respective drive shaft 250A, 250B, where the shoulder axis of rotation SAX is shared by the first and second SCARA arms 110, 120. The inner drive shaft 250C is connected to both forearm links 110F, 120F through a splitting drive pulley 606 (see also splitting drive pulley 906 in FIGS. 9A and 9B) that is coupled to the inner drive shaft 250C where the splitting drive pulley 606, 906 is rotatably mounted to rotate, as a unit, at the shoulder axis of rotation SAX of the drive section 108 under the motive power of the inner drive shaft 250C. In one aspect, the splitting drive pulley 606, 906 is at least partially located within each of the upper arm links 110U, 120U. In other aspects, where the transport apparatus 100 includes two or more SCARA arms (e.g. at least two) there may be a drive axis for driving each upper arm link of the at least two SCARA arms and additional drive axes for driving at least one splitting drive pulley connected to the forearm links of the at least two SCARA arms, such as where each splitting drive pulley drives rotation of at least two forearms. In one aspect, the splitting drive pulley 606, 906 is coupled to at least two idler pulleys 600, 601 where one of the at least two idler pulleys 600, 601 is connected to the first SCARA arm 110 to effect extension and retraction of the first SCARA arm 110 and another of the at least two idler pulleys 600, 601 is connected to the second SCARA arm 120 to effect extension and retraction of the second SCARA arm 120.

In one aspect, each of the upper arm links 110U, 120U includes an idler pulley 600, 601 located at a respective one of the elbow axes of rotation EX1, EX2. Each idler pulley 600, 601 is mounted to the respective upper arm link 110U, 120U about the respective elbow axis of rotation EX1, EX2 so as to rotate about the elbow axis of rotation EX1, EX2 independent of the upper arm links 110U, 120U. For example, any suitable bearings 620A, 620B may be provided within the upper arm links 110U, 120U to which the idler pulleys 600, 601 are mounted for rotation about the elbow axes of rotation EX1, EX2. Each idler pulley 600, 601 is coupled to a respective forearm link 110F, 120F so that the idler pulley 600, 601 rotates as a unit with the respective forearm link 110F, 120F about the respective elbow axis of rotation EX1, EX2.

Figure 6C:
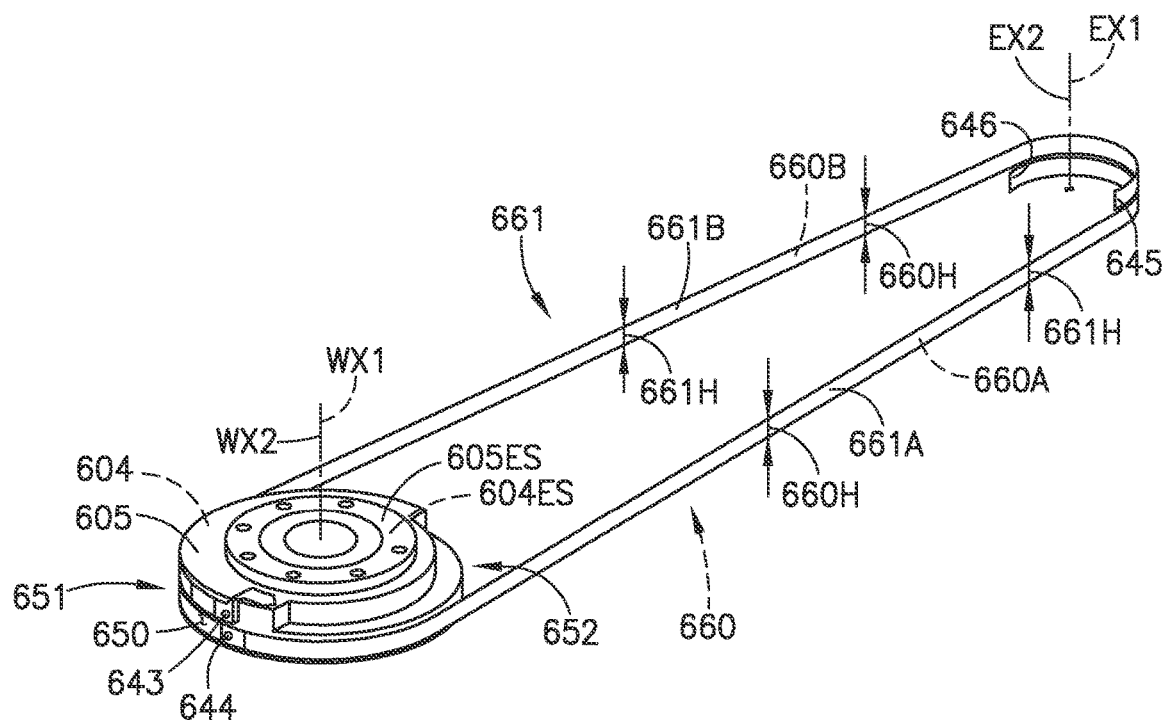
FIGS. 6C-6E are schematic illustrations of a portion of an end effector drive transmission in accordance with one or more aspects of the disclosed embodiment.
Figure 6D:
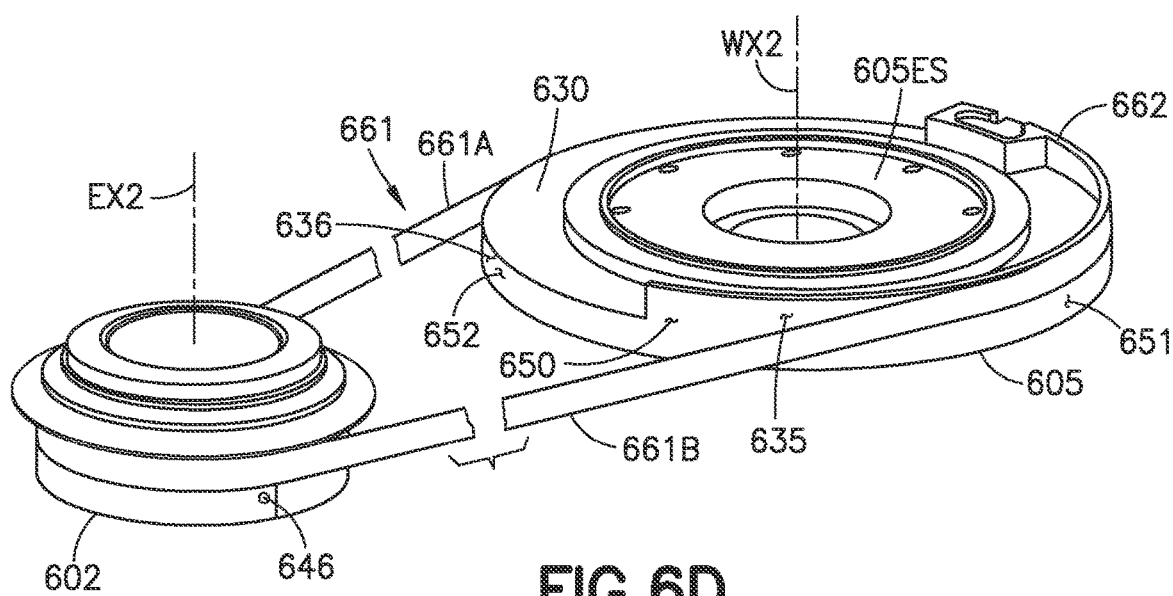
Figure 6E:
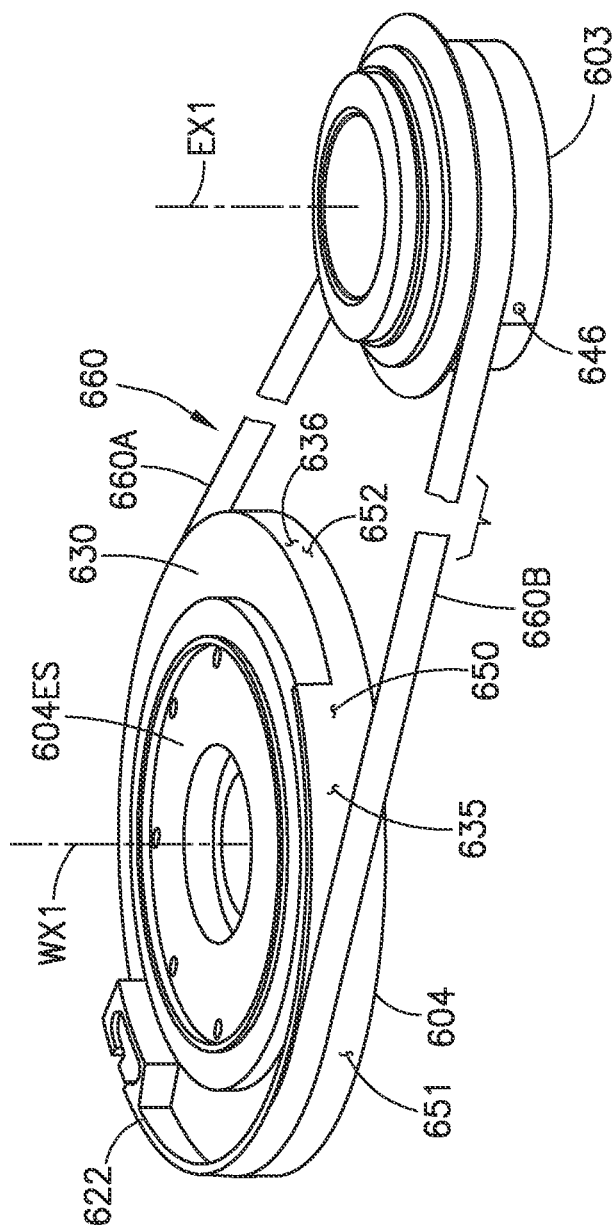
Figure 6L:
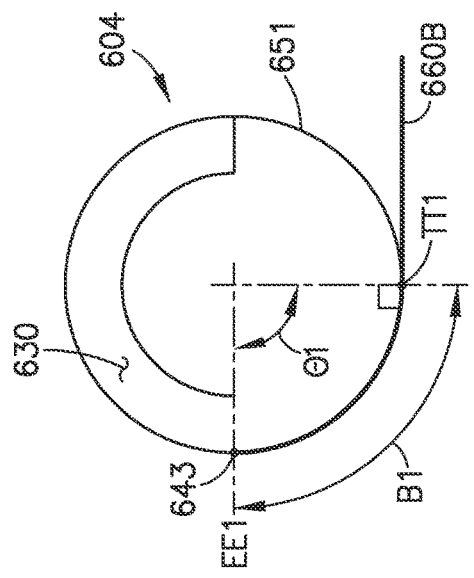
FIGS. 6J-6M are schematic illustrations of portions of a substrate transport apparatus in accordance with one or more aspects of the disclosed embodiment
Figure 6M:
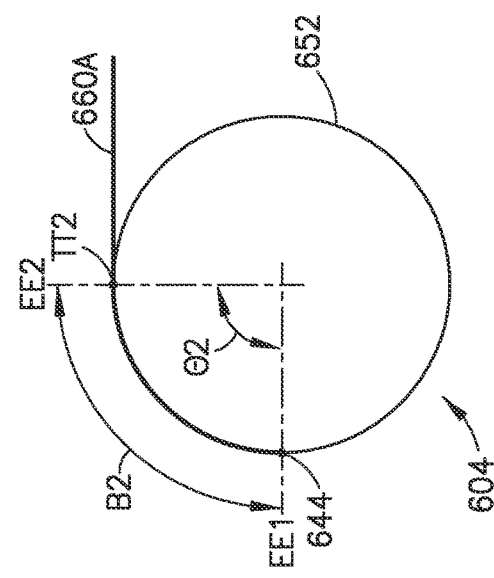
Figure 6J:
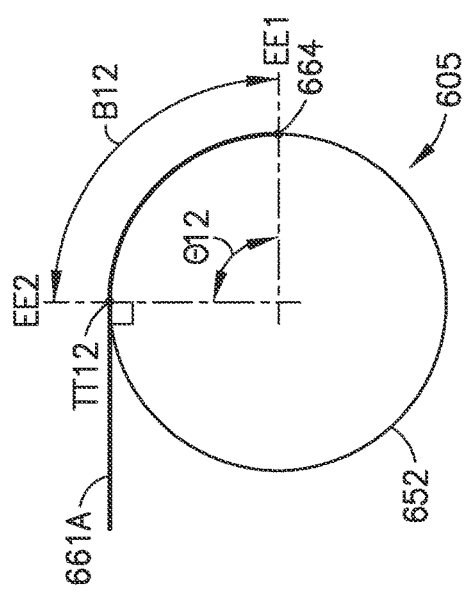
Figure 6K:
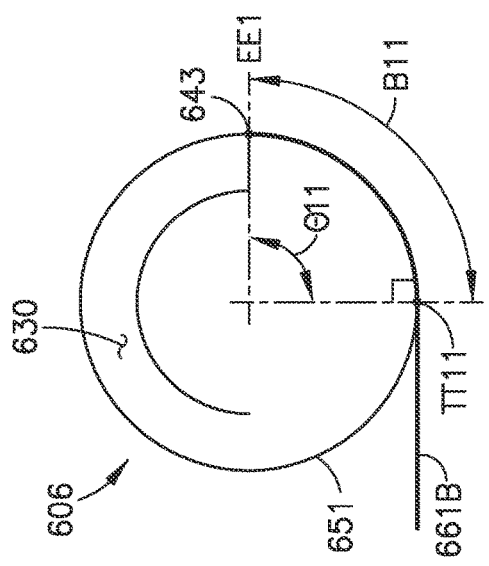
Figure 8A:
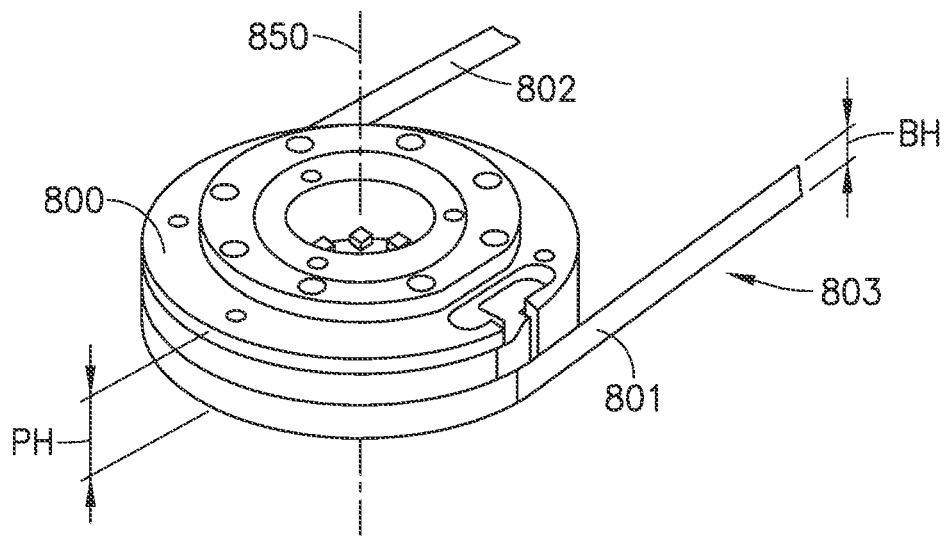
FIGS. 8A and 8B are schematic illustrations of a portion of a conventional substrate transport apparatus.
Figure 8B:
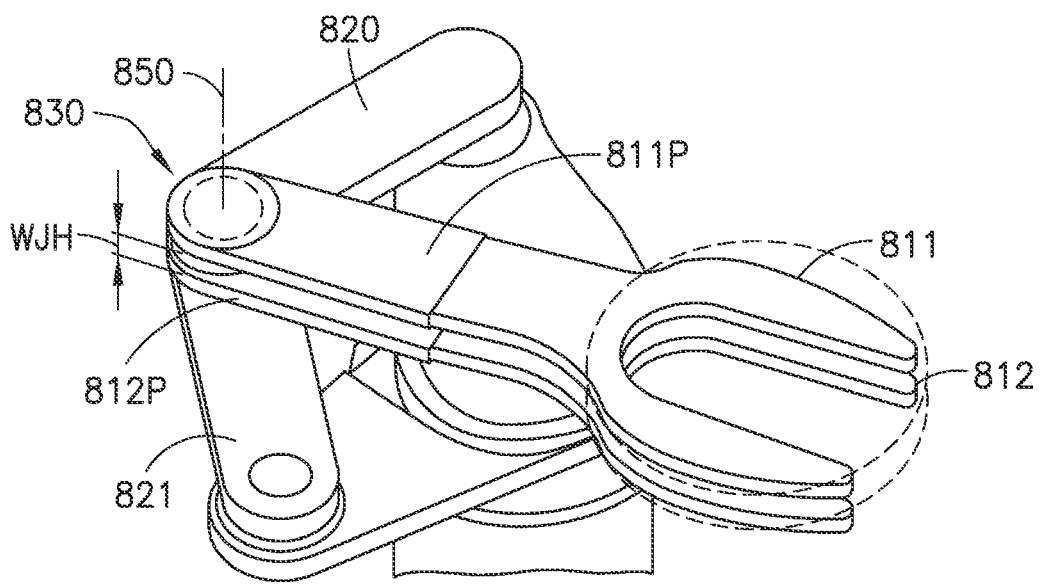

Referring to FIGS. 6A, 6C, and 6D, each end effector 110E, 120E is slaved to the upper arm link 110U, 120U of the respective SCARA arm 110, 120 so as to maintain alignment of the end effector 110E, 120E along the axis of extension and retraction of each SCARA arm 110, 120. For example, in one aspect, elbow drive pulley 603 (see FIGS. 6A and 6E) is mounted to the upper arm link 110U of SCARA arm 110 about the elbow axis of rotation EX1 in any suitable manner so that the elbow drive pulley 603 is rotatably fixed relative to the upper arm link 110U. Idler pulley 604 (e.g., the wrist joint pulley) is mounted within the forearm link 110F in any suitable manner for rotation about the wrist axis WX1. The idler pulley 604 has an inner diameter ID and an outer diameter OD (see FIG. 6F) such that the idler pulley 604 is sized and shaped to be admitted within and interface with couplings and other structure of a standard/conventional wrist joint of a standard/conventional transfer arm. For example, the wrist joint has a predetermined size and includes a shaft(s) SHT and bearings BRG having predetermined sizes based on, for example, a slot valve size, loads to be carried by the transfer arm, transfer chamber size, etc. Given these transfer arm constraints a conventional wrist pulley (such as shown in FIG. 8A) also has a predetermined size (e.g., inner and outer diameter, etc.). In accordance with the aspects of the disclosed embodiment, the idler pulley 604 is shaped and sized as described herein so as to reduce the wrist height of the transfer arm 110 given the same constraints imposed on the conventional wrist pulley. The end effector 110E is mounted to the idler pulley 604 so that SCARA arm 110 extension and retraction effects rotation, relative to the forearm 110F, of the idler pulley 604 and the coupled at least one end effector 110E together as a unit about the wrist axis WX1 as will be described in greater detail herein. The idler pulley 604 is coupled to the elbow drive pulley 603 in any suitable manner such as with a segmented transmission loop 660 having at least two separate bands 660A, 660B (substantially similar to band segments 701, 702, 711, 712 described herein), where each of the bands 660A, 660B wrap at least partially around the idler pulley 604 and the elbow drive pulley 603 in opposite directions so that as the forearm link 110F moves relative to the upper arm link 110U the relative rotation of the elbow drive pulley 603 with respect to the forearm link 110F at the elbow axis of rotation EX1 causes one of the bands 660A, 660B to pull on the idler pulley 604 while the other band 660A, 660B pushes on the idler pulley 604 effecting rotation of the idler pulley 604 and maintaining alignment of the end effector 110E along the axis of extension and retraction. The elbow drive pulley 603 and the idler pulley 604 may have a diameter ratio of about 1:2; however, in other aspects the elbow drive pulley 603 and the idler pulley 604 may have any suitable diameter ratio.

Similarly, elbow drive pulley 602 (see FIGS. 6A and 6D) is mounted to the upper arm link 120U of SCARA arm 120 about the elbow axis of rotation EX2 in any suitable manner so that the elbow drive pulley 602 is rotatably fixed relative to the upper arm link 120U. Idler pulley 605 (e.g., the wrist joint pulley) is mounted within the forearm link 120F in any suitable manner for rotation about the wrist axis WX2. The idler pulley 605 has an inner diameter ID and an outer diameter OD (see FIG. 6F) such that the idler pulley 604 is sized and shaped to be admitted within and interface with couplings and other structure of a standard/conventional wrist joint of a standard/conventional transfer arm in the same manner described above with respect to idler pulley 604. The end effector 120E is mounted to the idler pulley 605 so that SCARA arm 120 extension and retraction effects rotation, relative to the forearm 120F, of the idler pulley 605 and the coupled at least one end effector 120E together as a unit about the wrist axis WX2 as will be described in greater detail herein. The idler pulley 605 is coupled to the elbow drive pulley 602 in any suitable manner such as with a segmented transmission loop 661 having at least two separate bands 661A, 661B (substantially similar to band segments 701, 702, 711, 712 described herein), where each of the bands 661A, 661B wrap at least partially around the idler pulley 605 and the elbow drive pulley 602 in opposite directions so that as the forearm link 120F moves relative to the upper arm link 120U the relative rotation of the elbow drive pulley 602 with respect to the forearm link 120F at the elbow axis of rotation EX2 causes one of the bands 661A, 661B to pull on the idler pulley 605 while the other band 661A, 661B pushes on the idler pulley 605 effecting rotation of the idler pulley 605 and maintaining alignment of the end effector 120E along the axis of extension and retraction. The elbow drive pulley 602 and the idler pulley 605 may have a diameter ratio of about 1:2; however, in other aspects the elbow drive pulley 602 and the idler pulley 605 may have any suitable diameter ratio.

Referring to FIGS. 5H, 6A, 6C, 6D, 6E, 6F, and 6G, the end effector 110E, 120E and the idler pulley 604, 605 are configured so that a height 670 of the at least one end effector 110E, 120E is within a stack height profile 671 (FIG. 6G) of the wrist joint 110WJ, 120WJ (FIG. 6G) so that a total stack height 672 (FIG. 6G) of the at least one end effector 110E, 120E and wrist joint 110WJ, 120WJ is sized to conform with and pass through a pass-through 680 (FIG. 6G) of a slot valve 681 (FIG. 6G). The stack height profile 671 of the wrist joint 110WJ, 120WJ includes the respective idler pulley 604, 605 and SCARA arm extension extends the at least one end effector 110E, 120E and at least part of the respective idler pulley 604, 605 through the pass-through 680 of the slot valve 681. For example, in one aspect, the upper arms 110U, 120U, the forearms 110F, 120F, and the end effectors 110E, 120E have respective lengths 110UL, 120UL, 110FL, 120FL, 110EL, 120EL, (e.g., the length of each end effector may be measured from the wrist axis WX1, WX2 to a substrate holding location 110SHL, 120SHL of the end effector 110E, 120E) (and hence the respective transfer arm 110, 120) are configured to provide a long reach capable of accessing a deep substrate holding station 500 (see FIG. 5H) of a processing module PM4 (or other suitable processing module). While the upper arm links 110U, 120U and the forearm links 110F, 120F are illustrated has having substantially the same lengths 110FL, 120FL, 110UL, 120UL, in other aspects, the lengths 110UL, 120UL of the upper arm links 110U, 120U and the lengths 110FL, 120FL of the forearm links 110F, 120F may be unequal. The deep substrate holding station 500 is disposed within the processing module PM4 so that an offset distance DIST (i.e., disposed along an axis of extension and retraction R of the transfer arm 110, 120 from an inside face 520 of the transport chamber PM4 slot valve 681 pass-through (or port) 680 is consistent with and accommodated by extension of at least part of the forearm link 110F, 120F length 110FL, 120FL holding the wrist joint 110WJ, 120WJ (i.e., at the wrist axis WX1, WX2), where a portion of the length 110FL, 120FL of the forearm link 110F, 120F and the length 110EL, 120EL of end effector 110E, 120E from the wrist axis WX1, WX2 extend through the inside face 520 of the slot valve 681.

Still referring to FIGS. 6A, 6C, 6D, 6E, 6F, and 6G, the wrist joint 110WJ, 120WJ is configured to allow the respective transfer arm 110, 120 to conform within the pass-through 680 of the slot valve 681 (see FIG. 5H) as described above. In one aspect, a height 660H, 661H (see FIG. 6C) of the bands 660A, 660B, 661A, 661B of the respective segmented transmission loops 660, 661 is predetermined (e.g., based on an amount of torque to be transferred, kinematics of the transfer arm, etc.) such that a height 110HT, 120HT of the forearm 110F, 120F housing the respective bands 660A, 660B, 661A, 661B is at least in part a function of the band 660A, 660B, 661A, 661B height 660H, 661H. In other aspects, the height 110HT, 120HT of the forearm 110F, 120F may be a function of any suitable transfer arm characteristics.

As can be seen in, for example, FIGS. 4 and 6F, the end effector 110E, 120E overlaps the respective forearm 110F, 120F at the respective wrist joint 110WJ, 120WJ. As can be seen in FIGS. 1 and 4, the forearm 120F includes a recessed portion or cutout 120FR that provides freedom of movement of the end effector 120E, during extension and retraction of the transfer arm 120, relative to the forearm 120F within the recessed portion 120FR. A height 120H of the recessed portion 120FR may be such that the (upper) surface 120FS of the forearm 120F is substantially coplanar with or below an (upper) surface 120EPS of a wrist plate 120EP of end effector 120E. The recessed portion 120FR may be configured to provide the end effector 120E with any suitable amount of rotation about the wrist axis WX2 so as to effect extension and retraction of the end effector 120E to any suitable substrate holding station. As can also be seen in FIGS. 1 and 4, the forearm 110F includes a recessed portion or cutout 110FR that provides freedom of movement of the end effector 110E, during extension and retraction of the transfer arm 110, relative to the forearm 110F within the recessed portion 110FR. A height 110H of the recessed portion 110FR may be such that the (upper) surface 110FS of the forearm 110F is substantially coplanar with or below an (upper) surface 110EPS of a wrist plate 110EP of end effector 110E. The recessed portion 110FR may be configured to provide the end effector 110E with any suitable amount of rotation about the wrist axis WX1 so as to effect extension and retraction of the end effector 110E to any suitable substrate holding station.

FIG. 6F illustrates a cross-section of the overlap of the end effector 110E, 120E and the forearm 110F, 120F with the end effector 110E, 120E within the recessed portion 110FR, 120FR. As can be seen in FIG. 6F, an end effector 110E, 120E (bottom) interface 613 with the respective forearm 110F, 120F and the respective idler pulley 604, 605 is configured so as to provide any suitable clearance between the end effector 110E, 120E and the respective forearm 110F, 120F. In this aspect, the uppermost edge or surface 612 of the forearm 110F, 120F, within the recessed portion 110FR, 120FR, most adjacent the end effector 110E, 120E is located so that the idler pulley 604, 605 uppermost level edge 622 projects above the uppermost edge or surface 612 of the respective forearm 110F, 120F within the respective recessed portion 110FR, 120FR. In other aspects, uppermost level edge 622 of the idler pulley 604, 605 may be substantially coplanar with or below the uppermost edge or surface 612 of the forearm 110F, 120F.

Still referring to FIGS. 6A, 6C, 6D, 6E, 6F, and 6G, the idler pulley 605 has an end effector interface seating surface 605ES seated against the at least one end effector 120E. The end effector seating surface 605ES defines end effector level relative to the frame 106. The end effector interface seating surface 605ES is at a level common with or below at least one of the separate band segments 661A, 661B coupled to the idler pulley 605. As can be seen in, for example, FIGS. 6C and 6D the idler pulley 605 has a stepped pulley perimeter edge 650 having a first perimeter portion 651 with a first height 699 (FIG. 6F) and a second perimeter portion 652 with a second height 698 (FIG. 6F), the first height 699 being greater than the second height 698. The end effector 120E is coupled to the idler pulley 605 so that an end 437 (FIGS. 4 and 6F) of a wrist plate 120EP of the end effector 120E opposite the substrate holding location 120SHL is disposed adjacent the first perimeter portion 651. The stepped pulley perimeter edge 650 forms a recessed portion 630 of the idler pulley 605, where the end effector wrist plate 120EP is recessed into the recessed portion 630 so that the total stack height 672 (FIG. 6G) of the at least one end effector 120E and wrist joint 120WJ is sized to conform with and pass through the pass-through 680 (FIG. 6G) of the slot valve 681 (FIG. 6G).

Each transfer arm 110, 120 includes a respective segmented transmission loop 660, 661 of separate band segments 660A, 660B, 661A, 660B (or any other suitable transmission link such as cable segments) coupled to the respective idler pulley 604, 605 effecting rotation of the idler pulley 604, 605. The stepped pulley perimeter edge 650 forms band wrap surfaces 635, 636 that interface with respective bands 661A, 661B of the segmented transmission loop 661. Band anchor points 643, 644 joining each of the separate band segments 661A, 661B to the idler pulley 605 are disposed so that at least one of the separate band segments, such as band segment 661B, wraps on the idler pulley 605 so that a pulley perimeter edge, most proximate the at least one end effector 120E (e.g., most proximate the substrate holding location 120SHL of the end effector 120E), and opposite the at least one separate band segment 661B wrap, is disposed at or below a level of the wrap. For example, the first perimeter portion 650 forms an upper band wrap surface 635 around which the band 661B is wrapped. The second perimeter portion 652 forms a lower band wrap surface 636 around which the band 661A is wrapped. The upper and lower band wrap surfaces 635, 636 are disposed at different heights on the idler pulley 605 so that the bands 661A, 661B are disposed in different planes relative to each other (i.e., one band does not wrap over the other band). As shown in FIG. 6F, at least one of the band segments, such as band segment 661B, has a standing height (corresponding to the height of the upper band wrap surface) spanning upright (e.g., substantially parallel with the wrist axis WX2) across a level contact/seating surface 610 of the end effector 120E that contacts and seats against a level surface 615 (e.g., defined by the end effector interface seating surface 605ES) of the idler pulley 605 forming part of the coupling between idler pulley 605 and the end effector 120E.

As shown in FIG. 6F at least one separate band segment, such as band segment 661B, is disposed proximate the level edge 622 of the idler pulley 605 adjacent the at least one end effector 120E, and projects out towards the at least one end effector 120E from a level seating surface 610 of the at least one end effector 120E seated against the idler pulley 605. In this aspect, the end effector 120E (bottom) interface 613 with the forearm 120F and the idler pulley 605 includes any suitable recess 614 that provides clearance in which the band segment 661B is at least partially disposed. Referring also to FIG. 6I, the recess 614 may form an opening or space 619 in a sidewall 620 of the wrist plate 120EP, through which opening 619 the band segment 661B extends between the idler pulley 605 and the elbow drive pulley 602.

Similarly, the idler pulley 604 has an end effector interface seating surface 604ES seated against the at least one end effector 110E. The end effector seating surface 604ES defines end effector level relative to the frame 106. The end effector interface seating surface 604ES is at a level common with or below at least one of the separate band segments 660A, 660B coupled to the idler pulley 604. As can be seen in, for example, FIGS. 6C and 6E the idler pulley 604 has a stepped pulley perimeter edge 650 having a first perimeter portion 651 with a first height 699 (FIG. 6F) and a second perimeter portion 652 with a second height 698 (FIG. 6F), the first height 699 being greater than the second height 698. The end effector 110E is coupled to the idler pulley 604 so that an end 438 (FIGS. 4 and 6F) of a wrist plate 110EP of the end effector 110E opposite the substrate holding location 110SHL is disposed adjacent the first perimeter portion 651. The stepped pulley perimeter edge 650 forms a recessed portion 630 of the idler pulley 604, where the end effector wrist plate 110EP is recessed into the recessed portion 630 so that the total stack height 672 (FIG. 6G) of the at least one end effector 110E and wrist joint 110WJ is sized to conform with and pass through the pass-through 680 (FIG. 6G) of the slot valve 681 (FIG. 6G).

The stepped pulley perimeter edge 650 forms band wrap surfaces 635, 636 that interface with respective bands 660A, 660B of the segmented transmission loop 660. Band anchor points 643, 644 joining each of the separate band segments 660A, 660B to the idler pulley 604 are disposed so that at least one of the separate band segments, such as band segment 660B, wraps on the idler pulley 604 so that a pulley perimeter edge, most proximate the at least one end effector 110E (e.g., most proximate the substrate holding location 110SHL of the end effector 110E), and opposite the at least one separate band segment 660B wrap, is disposed at or below a level of the wrap. For example, the first perimeter portion 650 forms an upper band wrap surface 635 around which the band 660B is wrapped. The second perimeter portion 652 forms a lower band wrap surface 636 around which the band 660A is wrapped. The upper and lower band wrap surfaces 635, 636 are disposed at different heights on the idler pulley 604 so that the bands 660A, 660B are disposed in different planes relative to each other (i.e., one band does not wrap over the other band). As shown in FIG. 6F, at least one of the band segments, such as band segment 660B, has a standing height (corresponding to the height of the upper band wrap surface) spanning upright (e.g., substantially parallel with the wrist axis WX1) across a level contact/seating surface 610 of the end effector 110E that contacts and seats against a level surface 615 (e.g., defined by the end effector interface seating surface 604ES) of the idler pulley 604 forming part of the coupling between idler pulley 604 and the end effector 110E.

As shown in FIG. 6F at least one separate band segment, such as band segment 660B) is disposed proximate a level edge 622 of the idler pulley 604 adjacent the at least one end effector 110E, and projects out towards the at least one end effector 110E from a level seating surface 610 of the at least one end effector 110E seated against the idler pulley 604. In this aspect, the end effector 110E (bottom) interface 613 with the forearm 110F and the idler pulley 604 includes any suitable recess 614 that provides clearance in which the band segment 660B is at least partially disposed. Referring also to FIG. 6H, the recess 614 may form an opening or space 619 in a sidewall 620 of the wrist plate 110EP, through which opening 619 the band segment 660B extends between the idler pulley 605 and the elbow drive pulley 602.

Referring to FIGS. 6C-6E and 6J-6M, the location of each band anchor point 643, 644 on the respective idler pulley 604, 605 defines a band engagement arc B1, B2, B11, B12 with the respective idler pulley 604, 605 so that the included angle of rotation θ1, θ2, θ11, θ12, between the band engagement arc B1, B2, B11, B12 and a tangent point TT1, TT2, TT11, TT12 at which the band anchor point 643, 644 forms a tangent between the respective band segment 660A, 660B, 661A, 661B and the respective idler pulley 604, 605, is about 90 degrees or less.

In one aspect the idler pulley 604, 605 and the respective elbow drive pulley 603, 603 to which the idler pulley 604, 605 is coupled by the segmented transmission loops 660, 661 have any suitable drive ratio that provides sufficient rotation of the respective end effectors 110F, 120F to extend and retract the SCARA arms 110, 120 for picking and placing substrates from and to predetermined substrate holding locations arranged a predetermined distance away from the shoulder axis SAX. For example, the ratio between the elbow drive pulley 602, 603 and the respective idler pulley 604, 605 is configured so that the band anchor point 643, 644 location on the idler pulley 604, 605 is so that the angle of rotation θ (see FIGS. 3A and 3B) of the respective end effector 110E, 120E for each SCARA arm 110, 120 extension motion (i.e. the drive axis rotation to effect idler pulley 604, 605 rotation for full extension and retraction of the arm SCARA 110, 120) results in at least one arc (e.g. arcs B1, B2, B11, B12) on the idler pulley 604, 605 so that a band anchor point 643, 644 of one band segment 660A, 660B, 661A, 661B at one end EE1 of the arc B1, B2, B11, B12 on one perimeter portion 651, 652 of the respective idler pulley 604, 605 is no more than coincident with the band anchor point 643, 644 of an opposing band segment 660A, 660B, 661A, 661B on another perimeter portion 651, 652 of the respective idler pulley 604, 605. For example, as illustrated in FIG. 6C band anchor points 643, 644 for opposing band segments 661A, 661B are located substantially one above the other and band anchor points 643, 644 of opposing band segments 660A, 660B are located substantially one above the other. In other aspects, the band anchor points 643, 644 of one band segment 660A, 660B, 661A, 661B may be circumferentially separated from the band anchor point 643, 644 of the respective opposing band segment 660A, 660B, 661A, 661B by any suitable amount.

As can also be seen in FIG. 6C, the band anchor points 645, 646 of the band segments 660A, 660B, 661A, 661B that couple the band segments 660A, 660B, 661A, 661B to the respective elbow drive pulley 602, 603 are located substantially 180° apart. As such, in the example shown in FIGS. 6C-6E and 6J-6M (noting as described above, the diameter ratio between elbow drive pulley 602, 602 and the respective idler pulley 604, 605 is about 1:2) the band anchor points 645, 646 are spaced on the elbow drive pulley 602, 603 and the band anchor points 643, 644 are spaced on the idler pulley 604, 605 so that about ±180 degree rotation of the elbow drive pulley 602, 603 results in about a ±90 degree rotation of the respective idler pulley 604, 605 (noting that the 0° degree configuration of the band pulley transmission is illustrated in FIGS. 6C-6E and 6J-6M with the band anchor points 643, 644 facing substantially directly away from the elbow drive pulley 602, 603) but in other aspects, where the drive ratio of the elbow drive pulley 602, 603 to the idler pulleys 604, 605 is greater than about 1:2 (as described below) the relative location between the band anchor points along the circumference of the elbow drive pulley 602, 603 and/or the idler pulley 604, 605 may be different than that described above.

On the other end EE2 of the arc B1, B2, B11, B12 the band anchor point 643, 644 is positioned so that the included angle of rotation θ1, θ2, θ11, θ12, between the end EE1 of the band engagement arc B1, B2, B11, B12 and the tangent point TT1, TT2, TT11, TT12 is about 90 degrees or less (i.e. the band segment 660A, 660B, 661A, 661B is tangent to the respective idler pulley 604, 605 and is in pure tension with no bending of the band segment 660A, 660B, 661A, 661B around the respective idler pulley 604, 605).

In one aspect, as noted above, the elbow drive pulley 602, 603 and the respective idler pulleys 604, 605 may have about a 1:2 ratio so that about a ±180 degree rotation of the elbow drive pulley 602, 603 effected by the controller 199 causes about ±90 degrees of rotation of the respective idler pulley 604, 605 (e.g. corresponding to the band engagement arcs B1, B2, B11, B12). As noted above, in other aspects, the drive ratio between the elbow drive pulley 602, 603 and the respective idler pulleys 604, 605 may be greater than about 1:2. For example, the drive ratio between the elbow drive pulley 602, 603 and the respective idler pulleys 604, 605 may be about 1:2.5, about 1:3, about 1:4 or any other suitable drive ratio configured to effect full extension and retraction of the SCARA arms 110, 120 and/or rotation of one SCARA arm 110, 120 about the shoulder axis SAX relative to the other SCARA arm 110, 120 (see e.g. FIGS. 5A-5G, such as where a drive having more than three degrees of freedom is provided).

Referring to FIGS. 4, 6A, 6D, 6E, 6G, and 6J-6M to effect the rotation of the idler pulley 604, 605 and the respective end effector(s) 110E, 120E coupled thereto, the idler pulleys 604, 605 may have different configurations (e.g., left hand and right hand configurations) for clockwise and counterclockwise rotation. For example, transfer arm 110 may be considered a right handed arm (as the arm is positioned on the right hand side of the axis of extension and retraction facing the extension direction (e.g., movement of the end effector away from the retracted configuration). Likewise, transfer arm 120 may be considered a left handed arm (as the arm is positioned on the left hand side of the axis of extension and retraction facing the extension direction.

Referring to the right handed transfer arm 110, the slaved configuration of the end effector 110E to the upper arm link 110U results in a counterclockwise rotation of the idler pulley 604 and the end effector 110E coupled thereto as the transfer arm 110 is extended along the axis of extension and retraction R from the retracted configuration illustrated in FIG. 4. To provide for the counterclockwise rotation of the idler pulley 604 the band segment 660B is disposed near the upper level (top) edge 622 of the idler pulley 604 on the opposite side of the wrist axis WX1 than the end effector substrate holding location 110SHL of the end effector 110 and the recessed portion 630 of the idler pulley 605. The band segment 660A is located beneath the end effector 110E and the end effector interface seating surface 604ES (e.g., so that the side of the idler pulley 604 on which the (lower) band segment 660A is located forms an unobstructed interface for the end effector 110 at the same level as the (top) band segment 660B). In this manner the band segments 660A, 660B can wrap around and unwrap from the idler pulley 604 without interfering with the end effector 110E seated on the end effector interface seating surface 604ES.

Referring to the left handed transfer arm 120, the slaved configuration of the end effector 120E to the upper arm link 120U results in a clockwise rotation of the idler pulley 605 and the end effector 120E coupled thereto as the transfer arm 120 is extended along the axis of extension and retraction R from the retracted configuration illustrated in FIG. 4. To provide for the clockwise rotation of the idler pulley 605 the band segment 661B is disposed near the upper level (top) edge 622 of the idler pulley 605 on the opposite side of the wrist axis WX2 than the end effector substrate holding location 120SHL of the end effector 120 and the recessed portion 630 of the idler pulley 605. The band segment 661A is located beneath the end effector 120E and the end effector interface seating surface 605ES (e.g., so that the side of the idler pulley 605 on which the (lower) band segment 661A is located forms an unobstructed interface for the end effector 120 at the same level as the (top) band segment 661B). In this manner the band segments 661A, 661B can wrap around the idler pulley 605 and unwrap from the idler pulley 605 without interfering with the end effector 120E seated on the end effector interface seating surface 605ES.

Referring also to FIGS. 7A-7C and 9A-9B the splitting drive pulley 606, 906 may be substantially similar to that described in U.S. patent application Ser. No. 15/634,871 filed on Jun. 27, 2017 and published as United States pre-grant publication number 2018/0019155 (published on Jan. 18, 2018) the disclosure of which is incorporated herein by reference in its entirety. The splitting drive pulley 606, 906 is coupled to idler pulleys 600, 601 by respective segmented transmission loops 700, 710. The segmented transmission loop 700 includes separate band segments 701, 702 while segmented transmission loop 710 includes separate band segments 711, 712. The band segments 701, 702, 711, 712 of each segmented transmission loop 700, 710 are arranged as opposing bands with respect to a direction of torque from the splitting drive pulley 606, 906 to the respective idler pulley 600, 601 where the respective segmented transmission loops 710, 711 oppose each other from the splitting drive pulley 606, 906 to the respective idler pulleys 600, 601 so that at least the idler pulleys are driven by the splitting drive pulley 606, 906 (and hence the corresponding degree of freedom of the drive section 108) at the same time and in the same direction. It is noted that while two idler pulleys 600, 601 are illustrated as being coupled to the splitting drive pulley, in other aspects, at least two idler pulleys are coupled to the splitting drive pulley so that the motive force provided by the single degree of freedom of the drive section is split between the at least two idler pulleys. Here, the splitting drive pulley 606, 906 is a common pulley splitting one degree of freedom of the drive section between at least the two idler pulleys 600, 601 so as to commonly drive the at least two idler pulleys 600, 601 from the one degree of freedom of the drive section 108. As will be described in greater detail below, the splitting drive pulley 606, 906 has multiple band interface levels or planes at which the band segments 701, 702, 711, 712 are affixed to the splitting drive pulley 606, 906. In one aspect, as will be described below, at least one of the band segments 701, 702, 711, 712 of each respective transmission loop 700, 710 share a common band interface level (e.g. are located in a common plane) so as to have a common band height rather than being disposed one above the other. Accordingly, the splitting drive pulley 606, 906 (which may also be referred to as a shoulder or hub pulley) may be described as being of a compact height compared to conventional shoulder or hub pulleys and correspondingly the dual arm SCARA transport apparatus has a resultant compact height compared to conventional dual arm SCARA transport apparatus.

Referring to FIGS. 9A and 9B, in one aspect, the splitting drive pulley includes two band interface levels 906L1, 906L2 where each band interface level 906L1, 906L2 is a common band interface level. For example, band segment 701 of segmented transmission loop 700 and band segment 712 of segmented transmission loop 710 are coupled to splitting drive pulley 906 at band interface level 906L2 at their respective band anchor points 770, 772 so that the band segments 701, 712 share a common band height BH in a manner similar to that described below with respect to splitting drive pulley 606. Band segment 702 of segmented transmission loop 700 and band segment 711 of segmented transmission loop 710 are coupled to splitting drive pulley 906 at band interface level 906L1 at their respective band anchor points 771, 773 so that the band segments 702, 711 share a common band height BH in a manner similar to that described below with respect to splitting drive pulley 606. Here the splitting drive pulley 906 is a one piece unitary member. In other aspects the splitting drive pulley may be constructed of more than one piece as described below.

Referring to FIGS. 6B and 7A-7C, in one aspect, one of the at least two SCARA arms 110, 120 may be a removable SCARA arm. For example, the first SCARA arm 110 may be removable as a unit from the frame 106 while the second SCARA arm 120 remains mounted to the frame 106. In this aspect, the splitting drive pulley 606 is a segmented pulley having a removable pulley segment 606B that includes at least one band interface level so as to remove the pulley segment 606B from the shoulder axis of rotation SAX. The pulley segments 606A, 606B are configured so that the pulley segment 606B can be removed from pulley segment 606A while pulley segment 606A remains fixed to the shoulder axis of rotation and the band segments 701, 702, 711, 712 of each transmission loop 700, 710 for each respective SCARA arm 110, 120 remain fixed to the corresponding pulley segment 606A, 606B. For example, pulley segment 606B may be rotatably mounted to upper arm link 110U about the shoulder axis of rotation SAX while pulley segment 606A may be rotatably mounted to upper arm link 120U about the shoulder axis of rotation SAX. Band segments 701, 702 of transmission loop 700 are coupled to pulley segment 606B while band segments 711, 712 of transmission loop 710 are coupled to pulley segment 606A. As the SCARA arm 110 is removed from the transport apparatus 100 the pulley segment 606B remains affixed to the upper arm 110U while the pulley segment 606A remains affixed to the upper arm 120U so that the SCARA arm 110 may be removed as a unit with the transmission loop 700 and pulley segment 606B affixed thereto.

In one aspect, each of the pulley segments 606A, 606B includes at least one mating feature that engages a corresponding mating feature of other pulley segment 606A, 606B where the mating features rotatably fix pulley segment 606A to pulley segment 606B so that the pulley segments 606A, 606B rotate as a unit about the shoulder axis of rotation SAX (i.e. the pulley segments are keyed to one another in a predetermined rotational orientation). For example, in one aspect, pulley segment 606A includes mating surface 730 that mates with mating surface 740 of pulley segment 606B. Pulley segment 606A may also include mating surface 731 that mates with mating surface 741 of pulley segment 606B. While mating surfaces 730, 731, 740, 741 are illustrated and described for rotatably fixing the pulley segments 606A, 606B so that the pulley segments rotate as a unit about the shoulder axis of rotation SAX, in other aspects the pulley segments 606A, 606B may be rotatably fixed in any suitable manner such as with one or more of pins, clips, shoulder bolts or any other suitable fasteners. As may be realized from FIGS. 6A-6B the compact height of the SCARA arm in the aspects of the disclosed embodiment may be readily reconfigured from two SCARA arm to one SCARA arm and vice versa. Further, the exemplary arm configuration illustrated in FIGS. 6A-6B has at least one SCARA arm that is interchangeable or may be swapped as a unit as previously described.

As can be seen in FIGS. 7A-7D the splitting drive pulley 606 includes three band interface levels 606L1, 606L2, 606L3 that accommodate the four band segments 701, 702, 711, 712 of the two transmission loops 700, 710. In one aspect, the removable pulley segment 606B includes band interface level 606L1 and interface level portion 606L2B of band interface level 606L2. Pulley segment 606A includes interface level portion 606L2A of band interface level 606L2 and interface level 606L3. In this aspect, band segment 701 is coupled to interface level 606L1 of pulley segment 606B at band anchor point 770 while band segment 702 is coupled to interface level portion 606L2B of pulley segment 606B at band anchor point 771. Band segment 712 is coupled to band interface level 606L3 of pulley segment 606A at band anchor point 772 while band segment 711 is coupled to interface level portion 606L2A of pulley segment 606A at band anchor point 773 so that band interface level 606L2 is common to both band segment 702 and band segment 711.

Referring also to FIGS. 7E-7H, the location of each band anchor point 770-773 on the splitting drive pulley 606, 609 defines a band engagement arc A1, A2, A11, A12 with the splitting drive pulley 606 so that the included angle of rotation α1, α2, α11, α12, between the band engagement arc A1, A2, A11, A12 and a tangent point T1, T2, T11, T12 at which the band anchor point 770, 771, 772, 773 forms a tangent between the respective band segment 701, 702, 711, 712 and the splitting drive pulley 606, is about 90 degrees or less.

Referring to FIGS. 7A-7H, in one aspect the splitting drive pulley 606, 609 and the at least two idler pulleys 600, 601 to which the splitting drive pulley 606, 609 is coupled by the transmission loops 700, 710 have any suitable drive ratio that provides sufficient rotation of the respective forearm links 110F, 120F to extend and retract the SCARA arms 110, 120 for picking and placing substrates from and to predetermined substrate holding locations arranged a predetermined distance away from the shoulder axis SAX. For example, the ratio between the splitting drive pulley 606, 609 and each of the idler pulleys 600, 601 is configured so that the band anchor point 770, 771, 772, 773 location on the splitting drive pulley 606, 609 is so that the angle of rotation β (see FIGS. 3A and 3B) for each SCARA arm 110, 120 extension motion (i.e. the drive axis rotation to effect idler pulley 600, 601 rotation for full extension and retraction of the arm SCARA 110, 120) results in at least one arc (e.g. arcs A1, A2, A11, A12) on the splitting drive pulley 606, 609 so that a band anchor point 770, 771, 772, 773 of one band segment 701, 702, 711, 712 at one end E1 of the arc A1, A2, A11, A12 is no more than coincident with the band anchor point 770, 771, 772, 773 of an opposing band segment 701, 702, 711, 712 on the same or different band interface level 606L1, 606L2, 606L3. For example, as illustrated in FIGS. 7A-7C and 9A band anchor points 770, 771 for opposing band segments 701, 702 are located substantially one above the other and band anchor points 772, 773 of opposing band segments 711, 712 are located substantially one above the other. In other aspects, the band anchor points 770, 771, 772, 773 may be circumferentially separated from the band anchor point 770, 771, 772, 773 of the opposing band segment 701, 702, 711, 712 by any suitable amount. In the example shown in FIGS. 7A-7H and 9A-9B the band anchor points 770, 771 are illustrated as being about 180 degrees apart from band anchor points 772, 773 so that about ±90 degree rotation of the splitting drive pulley 606, 906 results in about a ±180 degree rotation of the idler pulleys 600, 601 but in other aspects, where the drive ratio of the splitting drive pulley 606, 906 to the idler pulleys 600, 601 is greater than about 2:1 (as described below) the relative location between the band anchor points along the circumference of the splitting drive pulley may be different than about 180 degrees apart.

On the other end E2 of the arc A1, A2, A11, A12 the band anchor point 770, 771, 772, 773 is positioned so that the included angle of rotation a1, a2, a11, a12, between the end E1 of the band engagement arc A1, A2, A11, A12 and the tangent point T1, T2, T11, T12 is about 90 degrees or less (i.e. the band segment 701, 702, 711, 712 is tangent to the splitting drive pulley 606 and is in pure tension with no bending of the band segment 701, 702, 711, 712 around the splitting drive pulley 606, 906).

In one aspect, the splitting drive pulley 606, 906 and the idler pulleys 600, 601 may have about a 2:1 ratio so that about a ±90 degree rotation of the splitting drive pulley 606, 906 (e.g. corresponding to the band engagement arcs A1, A2, A11, A12) effected by the controller 199 causes about ±180 degrees of rotation of each idler pulley 600, 601. As noted above, in other aspects, the drive ratio between the splitting drive pulley 606, 906 and the idler pulleys 600, 601 may be greater than about 2:1. For example, the drive ratio between the splitting drive pulley 606, 906 and the idler pulleys 600, 601 may be about 2.5:1, about 3:1, about 4:1 or any other suitable drive ratio configured to effect full extension and retraction of the SCARA arms 110, 120 and/or rotation of one SCARA arm 110, 120 about the shoulder axis SAX relative to the other SCARA arm 110, 120 (see e.g. FIGS. 5A-5G) as described herein. As may be realized, where the drive ratio between the splitting drive pulley 606, 906 and the idler pulleys 600, 601 is greater than about 2:1 the controller 199 is configured to effect any suitable amount of rotation of the splitting drive pulley 606, 906, depending on the drive ratio, to fully extend and retract the SCARA arms 110, 120.

Figure 10A:
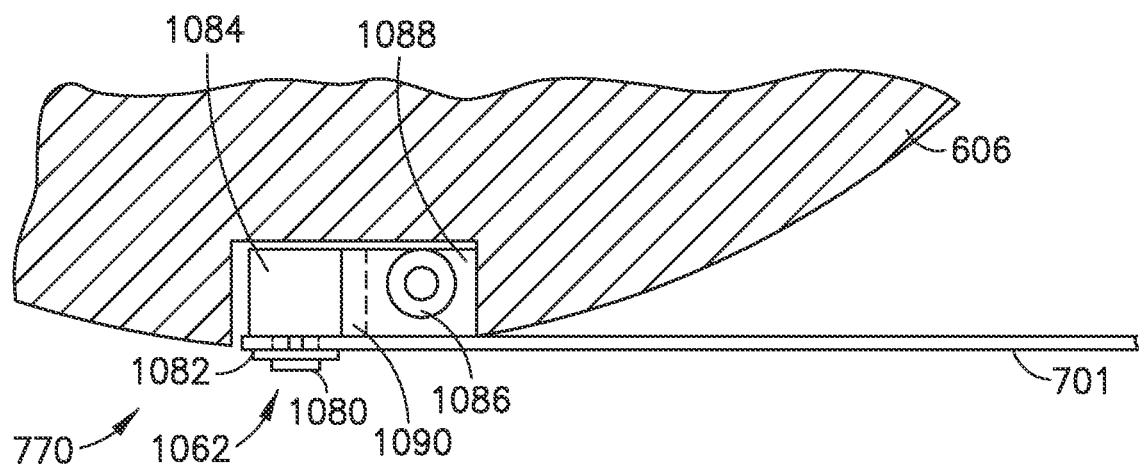
FIGS. 10A and 10B are schematic illustrations of portions of a substrate transport apparatus in accordance with one or more aspects of the disclosed embodiment.
Figure 10B:
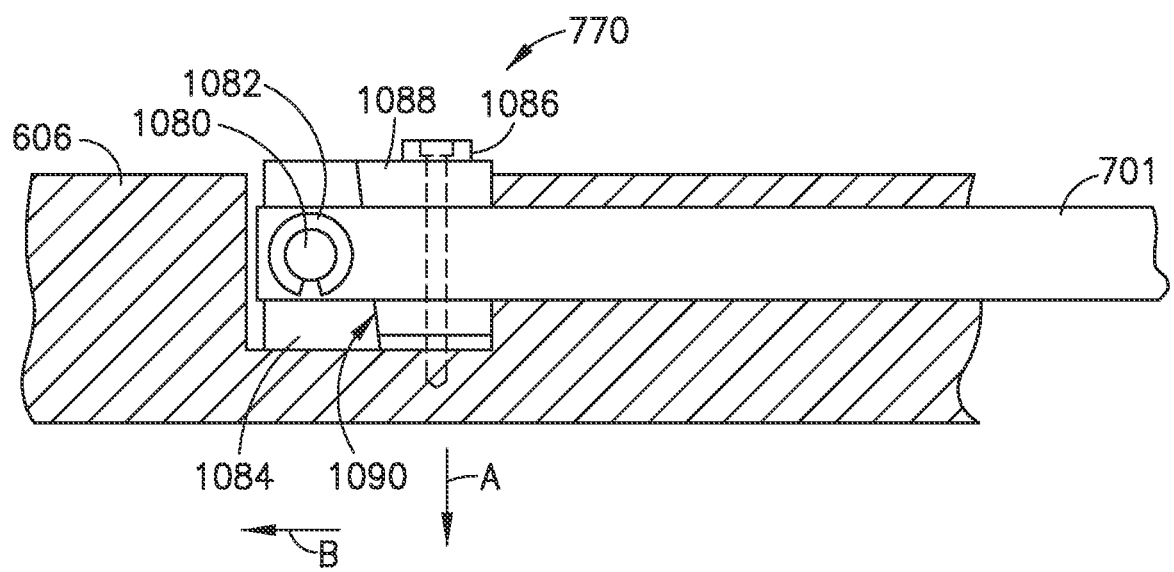

Referring to FIGS. 10A and 10B the band anchor points 770-773 (only band anchor point 770 is illustrated but it should be understood that the other band anchor points, including band anchor points 643, 644, are substantially similar to that described with respect to band anchor point 770) couple the respective band segments 701, 702, 711, 712 to the splitting drive pulley 606, 906. Further, while the band anchor points are described with respect to splitting drive pulley 606 it should be understood that the splitting drive pulley 906 (and the band anchor points for pulleys 600, 601, 602, 603, 604, 605) is substantially similar. For example, in one aspect, each band anchor point 770-773 includes a base 1084 to which a pin 1062 is mounted. The ends of each band segment 701, 702, 711, 712 include a hole through which a spoke 1080 of the pin 1062 projects. A retaining spring clip 1082, or other suitable retainer, is attached to the spoke 1080 to secure the band segment 701, 702, 711, 712 to the spoke 1080. The spoke 1080 projects from the base 1084 to provide an attachment location for the band segment 701, 702, 711, 712. In other aspects, the spoke 1080 could project directly from a circumferential edge or side of the splitting drive pulley 606, 906. In one aspect the hole in the band segment 701, 702, 711, 712 is slightly larger than the spoke 1080 and the retaining clip 1082 does not hold the band segment 701, 702, 711, 712 tightly so that the band segment 701, 702, 711, 712 is free to pivot around the spoke 1080. In one aspect, the base 1084 is an adjustable base that provides for location adjustment of the pin 1062 to thereby adjust the tension of the band segment 701, 702, 711, 712. For example, a screw 1086 passes into a threshold opening in the splitting drive pulley 606, 906 and holds a tightening wedge 1088 adjacent the splitting drive pulley 606, 906. One face of the tightening wedge 1088 engages a diagonal face 1090 of the base 1084. To increase the tension in the band segment 701, 702, 711, 712, screw 1086 is tightened, pushing tightening wedge 1088 down in the direction of arrow A. This pushes wedge 1088 against diagonal surface 1090, thereby forcing base 1084 to slide in the direction of arrow B. Conversely, to decrease the tension in the band segment 701, 702, 711, 712, screw 1086 is loosened. In other aspects, the band segments 701, 702, 711, 712 may be coupled to the splitting drive pulley 606, 906 and the other pulleys 600, 601, 602, 603, 604, 605 of the transport arm 100 in any suitable manner. Suitable examples of band anchor points may be found in U.S. Pat. No. 5,778,730 issued on Jul. 14, 1998, the disclosure of which is incorporated herein by reference in its entirety.

Figure 11A:
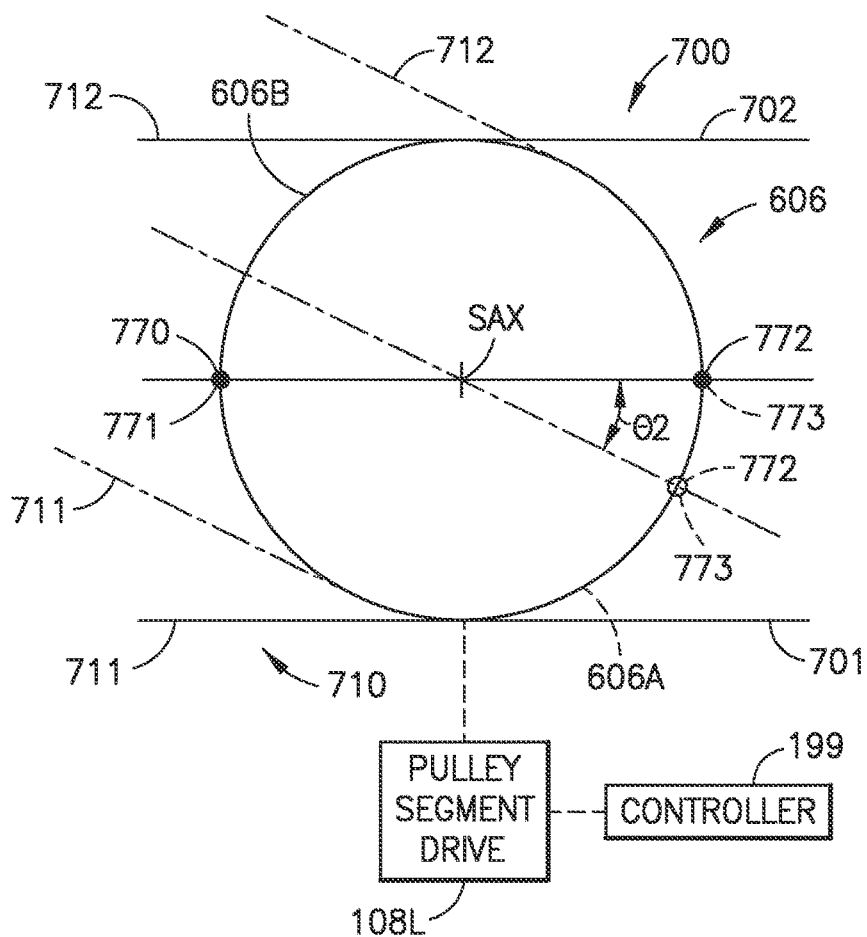
FIGS. 11A-11C are schematic illustrations of portions of a substrate transport apparatus in accordance with one or more aspects of the disclosed embodiment.
Figure 11B:
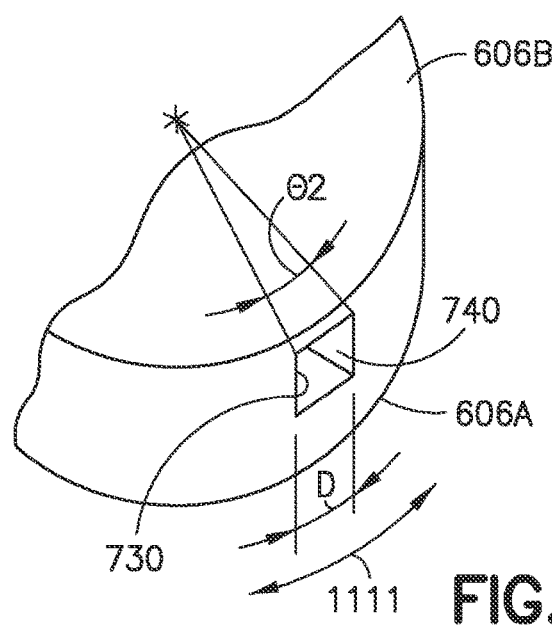
Figure 11C:
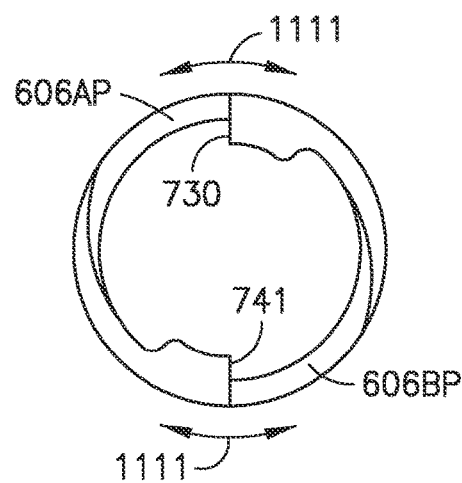

Referring again to FIGS. 2, 5A-5G, 7A-7D and also to FIGS. 11A-11C, in one aspect, the drive section 108 includes a limited pulley segment drive 108L configured to cause relative movement between pulley segment 606A and pulley segment 606B so that the SCARA arms 110, 120 may be rotated relative to one another about the shoulder axis of rotation SAX. For example, the SCARA arms 110, 120 illustrated in FIGS. 5A-5G have end effectors 110E, 120E that are located in the same plane (in other aspects the end effectors may be located on different planes). Here each SCARA arm 110, 120 accesses substrate process modules PM1-PM4 where, for example, SCARA arm 110 is movable relative to SCARA arm 120 so as to access any one of process modules PM2-PM4 while an axis of extension and retraction 400R of SCARA arm 120 is substantially aligned with process module PM1. To rotate SCARA arm 110 relative to SCARA arm 120 the limited pulley segment drive 108L may be disposed between the pulley segments 606A, 606B so that the limited pulley segment drive 108L is coupled to both pulley segments 606A, 606B. In other aspects, the limited pulley segment drive 108L may be disposed at any location within the upper arms 110U, 120U for effecting relative rotation between pulley segments 606A, 606B. The limited pulley segment drive 108L may be any suitable drive for effecting relative movement between the pulley segments 606A, 606B such as, for example, a solenoid, a stepper motor, a linear actuator, or a rotary actuator. In one aspect, a base 108LS of the limited pulley segment drive 108L may be mounted to pulley segment 606A (which is coupled to drive shaft 250C) while a moveable portion 108LM of the limited pulley segment drive 108L may be coupled to pulley segment 606B. The limited pulley segment drive 108L is coupled to controller 199 in any suitable manner so as to receive control signals for actuating the limited pulley segment drive 108L. In one aspect, the mating surfaces 730, 731, 740, 741 of the pulley segments 606A, 606B may be circumferentially spaced apart from one another by any suitable distance D where the distance D corresponds to the angle θ2 of relative movement between the pulley segments 606A, 606B and hence the SCARA arms 110, 120. To accommodate larger angles of relative movement a portion 606AP, 606BP of the pulley segments 606A, 606B along which the band segments 701, 702, 711, 712 interface (such as on band interface level 606L2) may be retractable so that as the corresponding mating surfaces 730, 731, 740, 741 contact one another the portions 606AP, 606BP move in direction 1111 relative to their respective pulley segments 606A, 606B. In still other aspects, the drive ratio between the pulley segments 606A, 606B and the idler pulleys 600, 601 may also be increased to provide relative rotation between the SCARA arms 110, 120 about the shoulder axis of rotation SAX.

Figure 5A:
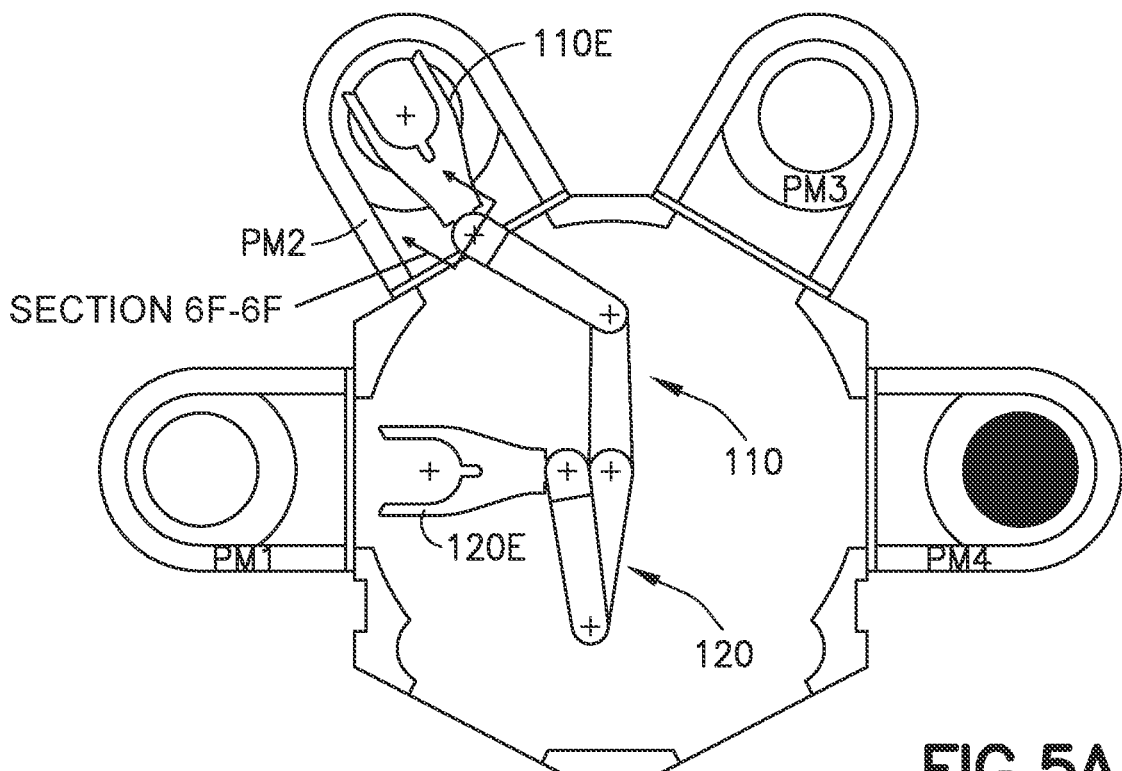
FIGS. 5A-5G are schematic illustrations of a substrate transport apparatus in accordance with one or more aspects of the disclosed embodiment.
Figure 5B:
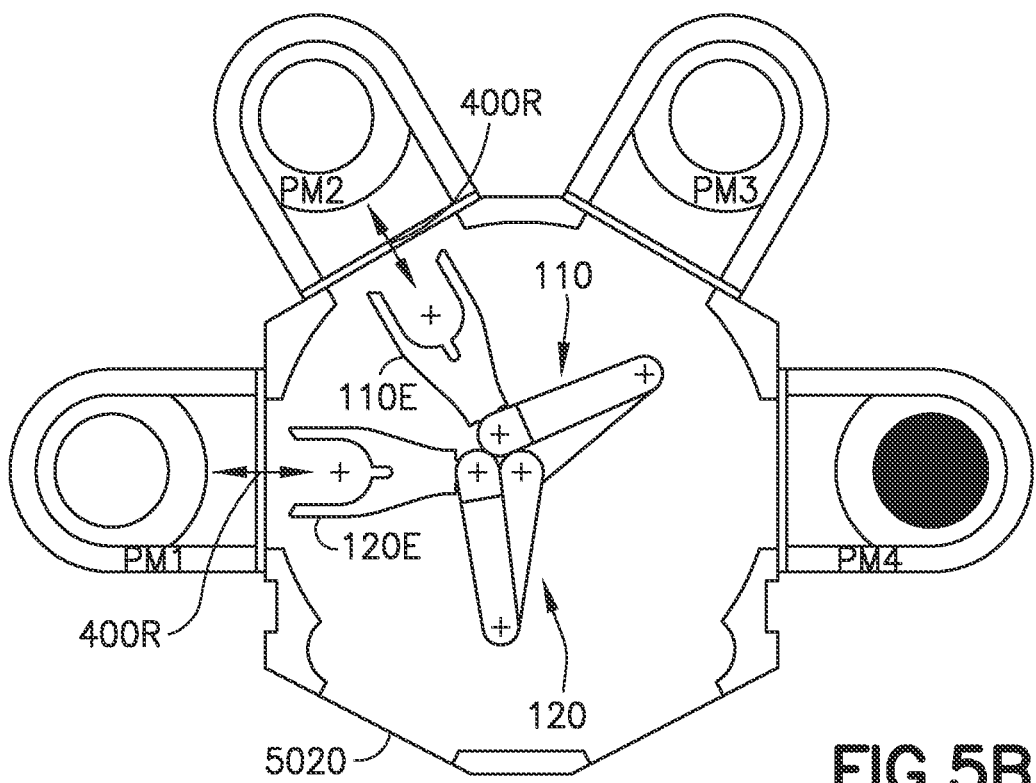
Figure 5C:
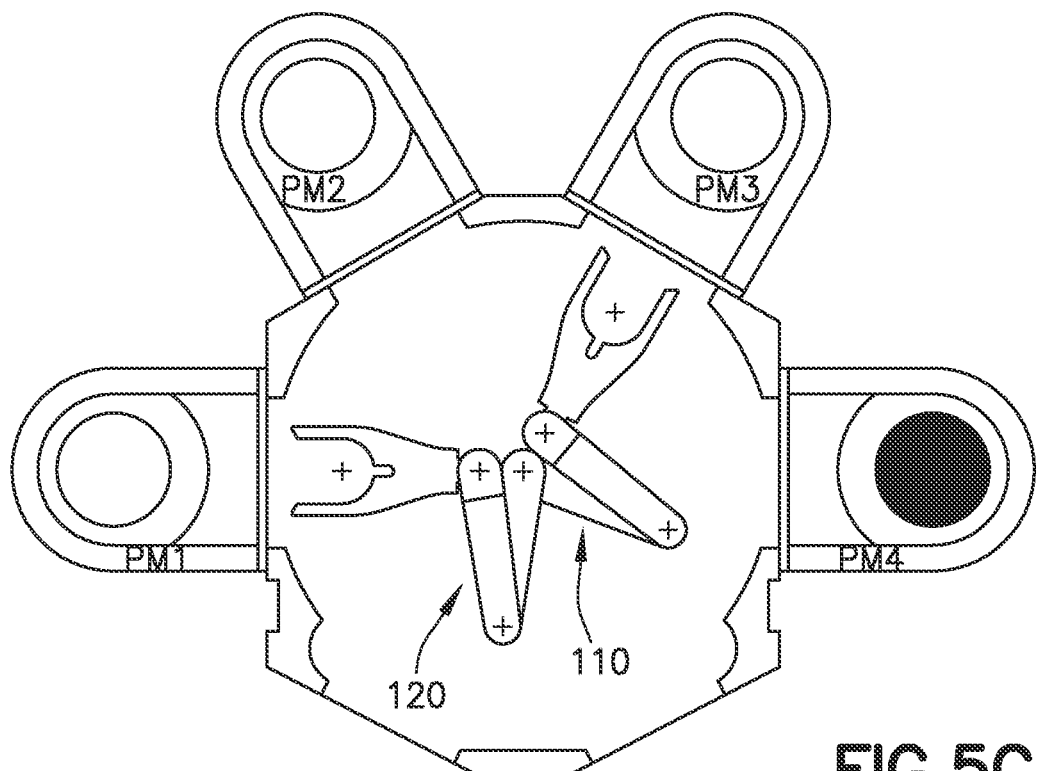
Figure 5D:
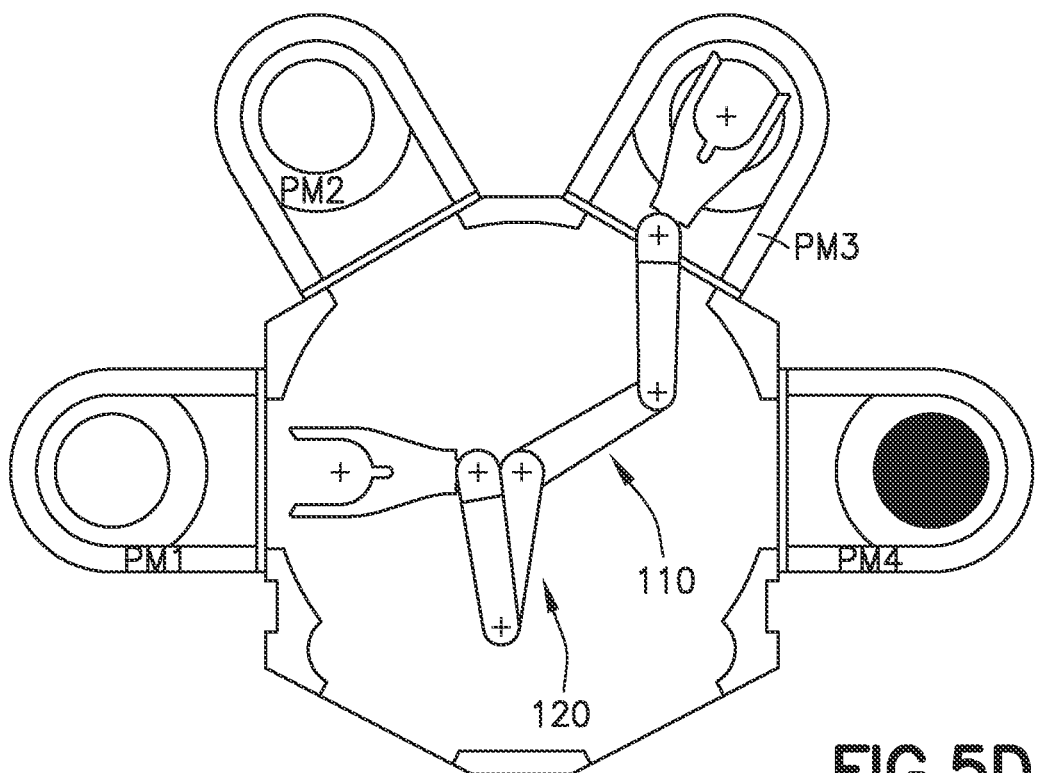
Figure 5E:
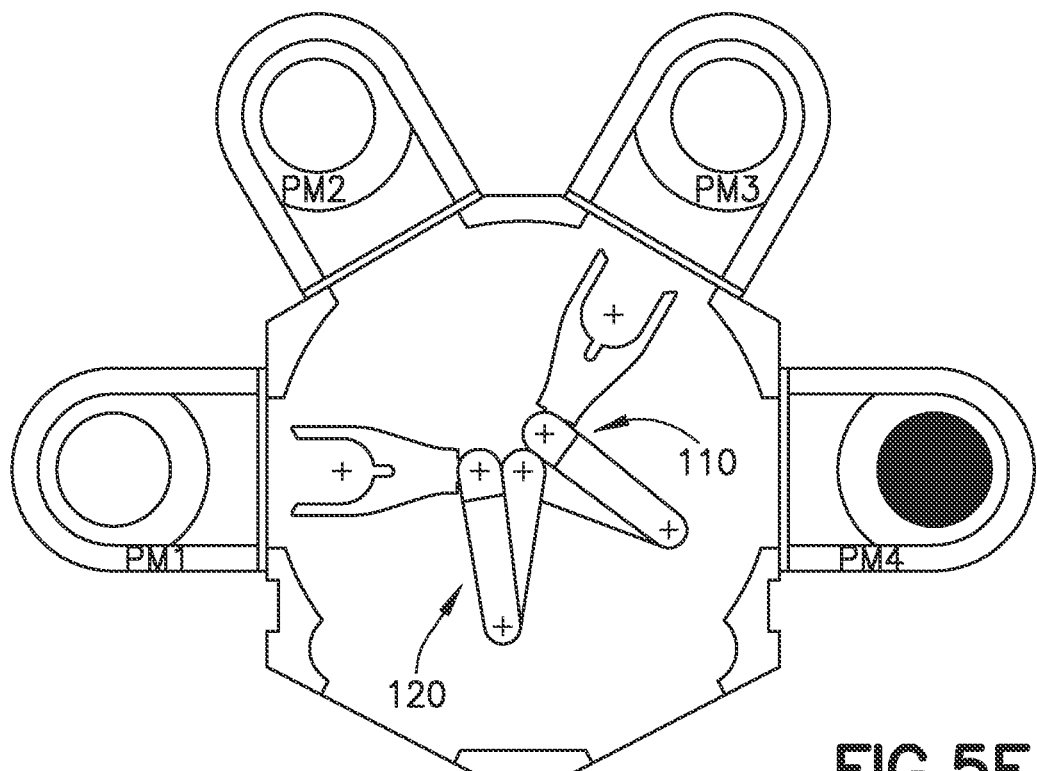
Figure 5F:
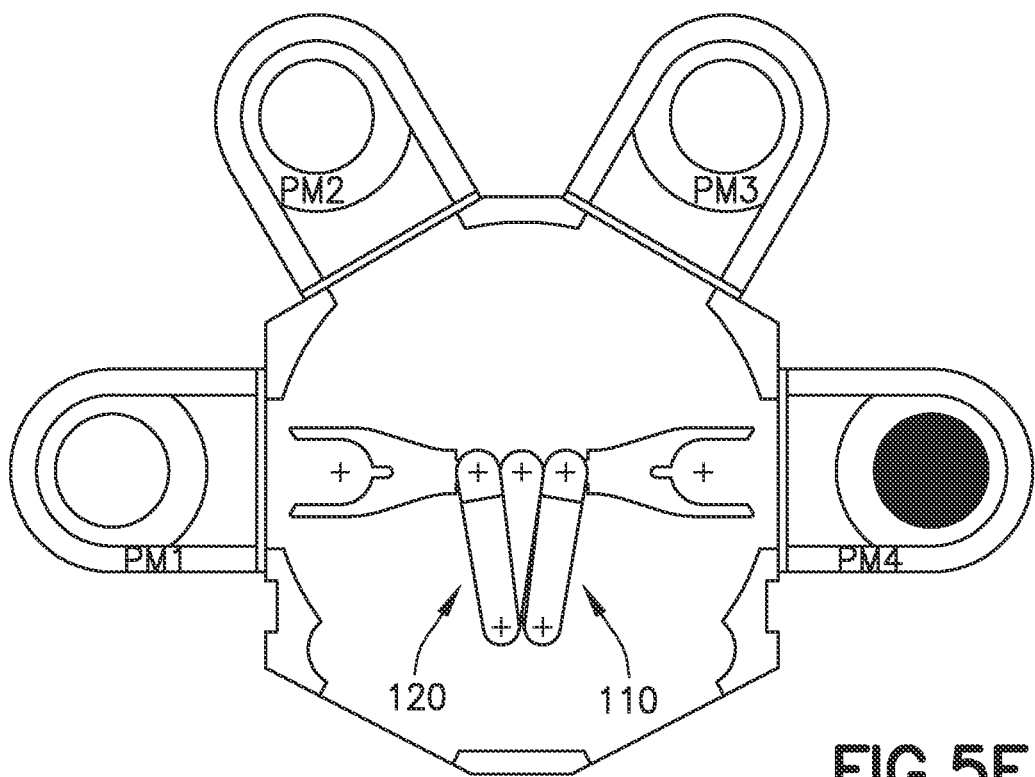
Figure 5G:
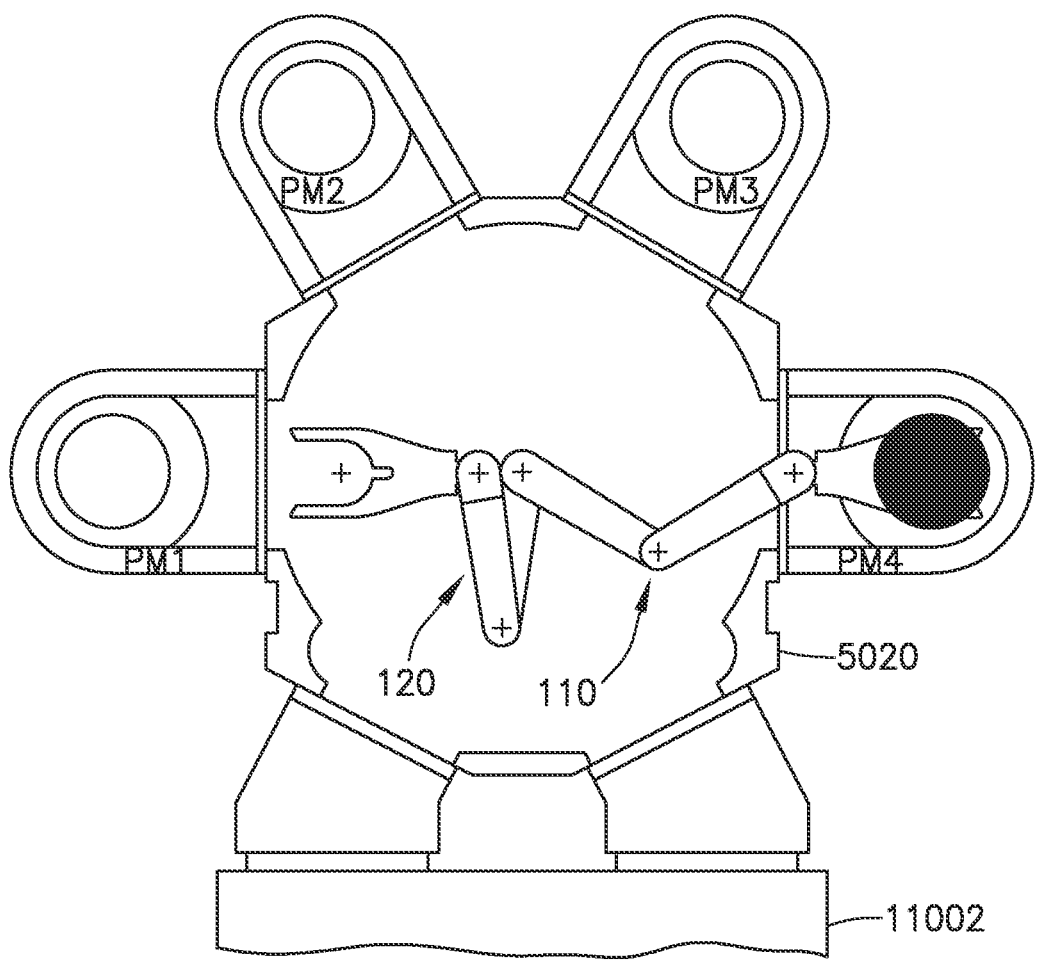
Figure 5H:
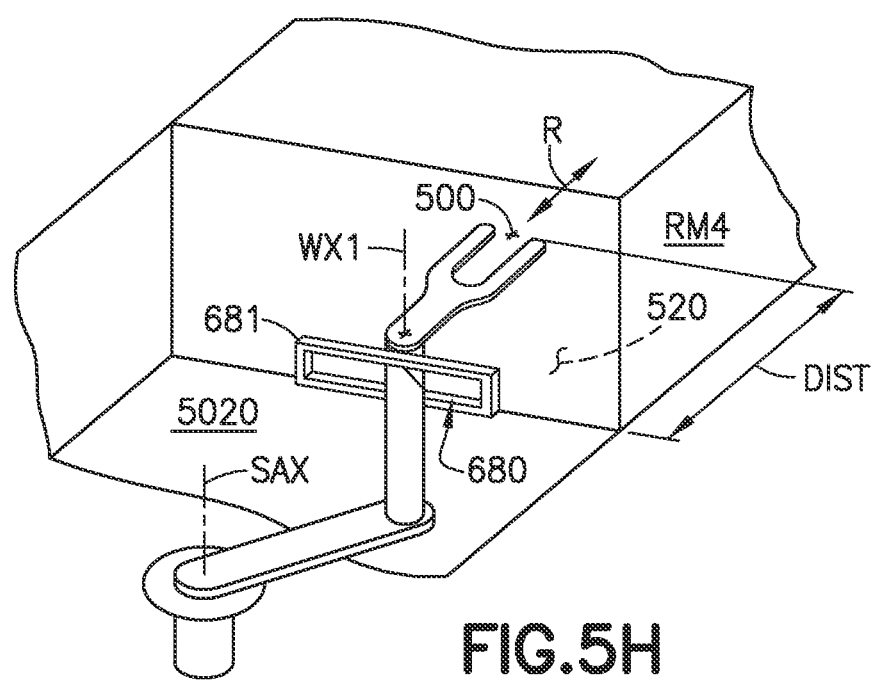
FIG. 5H is a schematic illustration of an extension of a transfer arm through a slot valve in accordance with one or more aspects of the disclosed embodiment.
Figure 12:
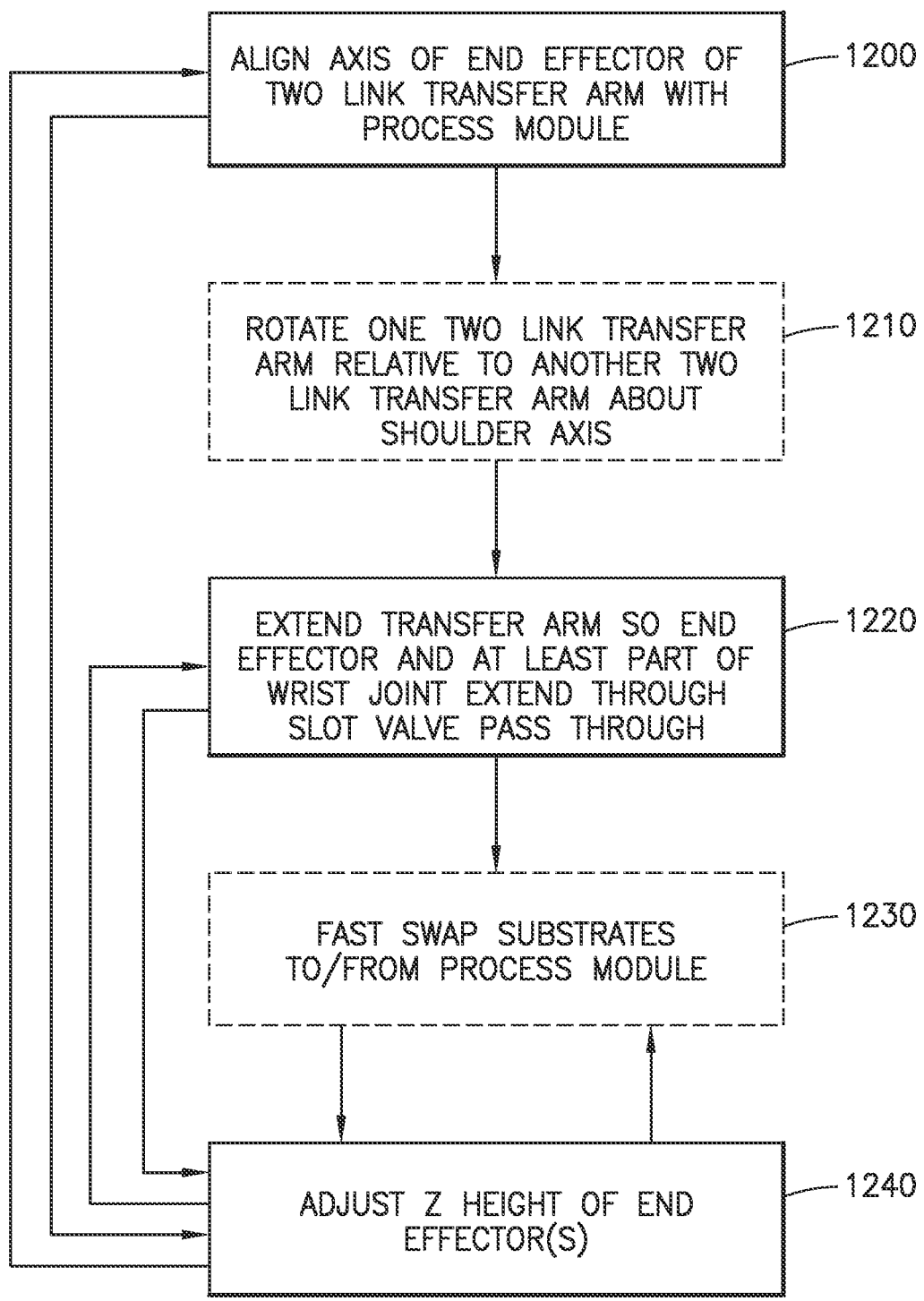
FIG. 12 is a flow diagram of a method in accordance with one or more aspects of the disclosed embodiment.

Referring to FIGS. 4, 5H, 6A, 6C-6E, 6G, and 12, in operation, the two link transfer arms 110, 120 may be aligned so that an axis of extension and retraction 400 of the end effectors 110E, 120E is aligned with a process module, such as process module PM4 (see FIGS. 4 and 5H) (FIG. 12, Block 1200), where both end effectors 110E, 120E of the transfer arms 110, 120 extend into the same or common process module. In other aspects, where each transfer arm 110, 120 is independently rotatably so as to have respective axes of extension and retraction 400R (as shown in FIG. 5B), the axis of extension of the end effector 110E for transfer arm 110 is aligned with, e.g., process module PM2 and an axis of extension and retraction 400R of end effector 120E for transfer arm 120 is aligned with, e.g., process module PM1 (FIG. 12, Block 1200). In one aspect, transfer arm 110 may be rotated relative to transfer arm 120 about the shoulder axis SAX so that the end effector 110E is aligned with one of process modules PM2-PM4 where at least the limited pulley segment drive 108L is actuated to rotate pulley segment 606A relative to pulley segment 606B by a predetermined amount so that the location of band anchor points 770, 771, 772, 772 of each segmented transmission loop 700, 710 change relative to one another about shoulder axis SAX (as can be seen in FIG. 11A) and the end effector 110E of transfer arm 110 is aligned with a predetermined one of the process modules PM2-PM4 (FIG. 12, Block 1210).

In one aspect, one or more of the drive shafts 250A-205C may be rotated in addition to actuation of the limited pulley segment drive 108L to effect relative rotation of the SCARA arms 110, 120 and maintain alignment of one or more of the end effectors 110E, 120E with a predetermined process module PM1-PM4. One or more drive shafts 250A-250C may be rotated to effect extension of one of the transfer arms 110, 120 so that the respective end effector 110E, 120E and the respective wrist joint 110WJ, 120WJ extend through the slot valve 681 pass-through 680 (see FIGS. 5H and 6G) (FIG. 12, Block 1220). In one aspect, the other transfer arm 110, 120 remains retracted while the one of the transfer arms 110, 120 is extended. In one aspect, as the one transfer arm 110, 120 is retracted from the process module, the other transfer arm 110, 120 may substantially simultaneously extend or extend after substantially full retraction of the at least one transfer arm 110, 120 so as to effect a fast swapping of substrates to/from the process module (FIG. 12, Block 1230). In one aspect, at least a portion of the wrist joint 110WJ, 120WJ or the entire the wrist joint 110WJ, 120WJ of each transfer arm 110, 120 may extend through the slot valve 681 pass-through or opening 680 for picking or placement of a substrate at a substrate holding location 500 of the respective process module for fast swapping substrates or substrate transfer without a fast swap.

As described above, the drive section 106 includes a Z axis drive 190 operably connected to at least one of the transfer arms 110, 120. The Z axis drive 190 generates Z axis travel of one or more of the at least one end effector 110E and the other end effector 120E so as to adjust the Z-height of the end effector 110E, 120E for passage through the slot valve 681 pass-through 680 (FIG. 12, Block 1240) based on a gap(s) GAP1, GAP2 (see FIG. 6G) between a respective total stack height 672 of a respective stack height profile 671 (FIG. 6G) and the pass-through 680. For example, the Z-height of the end effector 110E of arm 110 may be adjusted so that the end effector 110E and at least part of the wrist joint 110WJ extends through the pass-through 680 for transferring substrates to/from the process module. Upon substantial retraction of the arm 110, the Z height of the end effector 120E (such as where the end effectors are disposed one over the other as illustrated in FIG. 4) is adjusted so that the end effector 120E and at least part of the wrist joint 120WJ extends through the same or a different pass-through 680 for transferring substrates to/from the same or a different process module.

Figure 13:
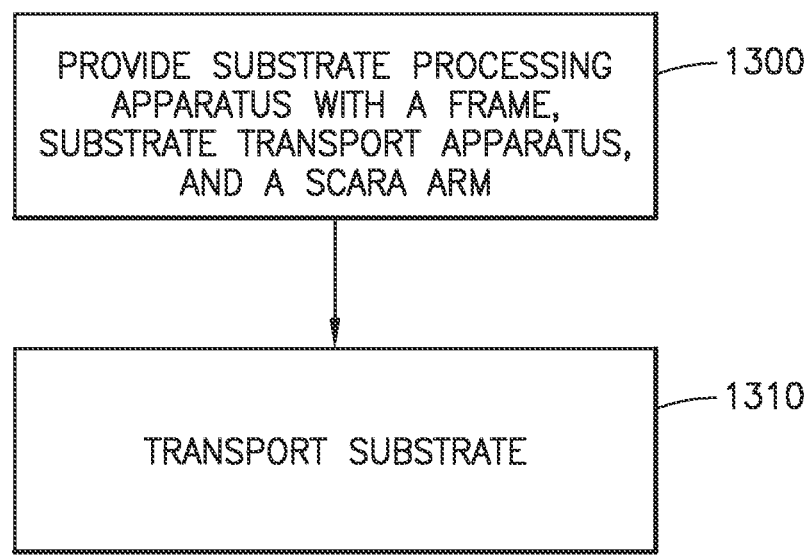
FIG. 13 is a flow diagram of a method in accordance with one or more aspects of the disclosed embodiment.

In one aspect, providing the substrate processing apparatus 100 is provided with a frame, a substrate transport apparatus coupled to the frame 106 including a drive section 108, with at least one degree of freedom, and a SCARA arm 110, 120, driven by the drive section 108, that is a two link arm plus an end effector 110E, 120E that is pivotally coupled to a forearm 110F, 120F, of the two link arm, by a wrist joint pulley 604, 605 configured so that an end effector level relative to the frame 106 is set by the wrist joint pulley 604, 605 and SCARA arm extension and retraction effects end effector 110E, 120E rotation, relative to the forearm 110F, 120F, via a transmission loop 660, 661 of separate band segments 660A, 660B, 661A, 661B joined to the wrist joint pulley 604, 605 (FIG. 13, Block 1300). The substrate S (FIG. 4) is transported (FIG. 13, Block 1310) with the end effector 110E, 120E by extending and retracting the SCARA arm 110, 120 with the at least one degree of freedom of the drive section 108. In transport, one of the band segments 660B, 661B wraps on the wrist joint pulley 604, 605, and around and over a contact surface 610 of the end effector 110E, 120E seated against a seating surface 604ES, 605ES of the wrist joint pulley 604, 605 setting the end effector level relative to the frame 106. In transporting the substrate S, the end effector 110E, 120E is moved in along a Z axis, with another degree of freedom of the drive section 108, to a substrate transport plane STP (FIG. 6G) defined by a slot valve 681 pass-through 680 connected to the frame 106, and transporting the substrate includes moving the end effector 110E, 120E along the substrate transport plane STP so that the end effector 110E, 120E and at least part of the wrist joint pulley 604, 605 pass through the slot valve 681 pass-through 680.

In accordance with one or more aspects of the disclosed embodiment a substrate processing apparatus comprises:

a frame;

a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm to rotate relative to the forearm about a wrist joint axis; and a drive section with at least one degree of freedom operably coupled via a transmission to the SCARA arm to rotate the SCARA arm about a shoulder axis at the shoulder joint and to articulate the SCARA arm in extension and retraction;

wherein the at least one end effector is coupled to a wrist joint pulley configured so that SCARA arm extension and retraction effects rotation, relative to the forearm, of the wrist joint pulley and the coupled at least one end effector together as a unit about the wrist joint axis; and wherein a height of the at least one end effector is within a stack height profile of the wrist joint so that a total stack height of the at least one end effector and wrist joint is sized to conform with and pass through a pass-through of a slot valve.

In accordance with one or more aspects of the disclosed embodiment the stack height profile of the wrist joint includes the wrist joint pulley and SCARA arm extension extends the at least one end effector and at least part of the wrist joint pulley through the pass-through of the slot valve.

In accordance with one or more aspects of the disclosed embodiment the substrate processing apparatus further comprises a segmented transmission loop of separate band segments coupled to the wrist joint pulley effecting rotation of the wrist joint pulley, at least one of the band segments has a height spanning upright across a level contact surface of the end effector that contacts and seats against a level surface of the wrist joint pulley forming part of the coupling between pulley and end effector.

In accordance with one or more aspects of the disclosed embodiment the substrate processing apparatus further comprises another SCARA arm, mounted to the frame so that the shoulder axis is a common shoulder axis to both the SCARA arm and other SCARA arm.

In accordance with one or more aspects of the disclosed embodiment the other SCARA arm has another end effector at another wrist joint and wherein the other end effector and other wrist joint define another stack height profile with a total stack height sized to conform with and pass through the pass-through of the slot valve.

In accordance with one or more aspects of the disclosed embodiment the SCARA arm and the other SCARA arm are configured so that the at least one end effector and the other end effector respectively define different transfer planes stacked over each other.

In accordance with one or more aspects of the disclosed embodiment the drive section includes a Z axis drive operably connected to at least one of the SCARA arm and the other SCARA arm, and the Z axis drive generates Z axis travel of one or more of the at least one end effector and the other end effector based on a gap between a respective total stack height of a respective stack height profile and the pass-through.

In accordance with one or more aspects of the disclosed embodiment the wrist joint pulley is coupled to the drive section by a segmented transmission loop of separate band segments, at least one separate band segment is disposed proximate a level edge of the wrist joint pulley adjacent the at least one end effector, and projects out towards the at least one end effector from a level seating surface of the at least one end effector seated against the wrist joint pulley.

In accordance with one or more aspects of the disclosed embodiment band anchor points joining each of the separate band segments to the wrist joint pulley are disposed so that at least one of the separate band segments wraps on the pulley so that a pulley perimeter edge, most proximate the at least one end effector, and opposite the at least one separate band segment wrap, is disposed at or below a level of the wrap.

In accordance with one or more aspects of the disclosed embodiment the wrist joint pulley has an end effector interface seating surface seated against the at least one end effector that defines end effector level relative to the frame, and the end effector interface seating surface is at a level common with or below at least one of the separate band segments coupled to the wrist joint pulley.

In accordance with one or more aspects of the disclosed embodiment a substrate processing apparatus comprises:

a frame;

a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm to rotate relative to the forearm about a wrist joint axis; and a drive section with at least one degree of freedom operably coupled via a transmission to the SCARA arm to rotate the SCARA arm about a shoulder axis at the shoulder joint and to articulate the SCARA arm in extension and retraction;

wherein at least one end effector is coupled to a wrist joint pulley configured so that SCARA arm extension and retraction effects rotation, relative to the forearm, of the wrist joint pulley and the coupled at least one end effector together as a unit about the wrist joint axis; and wherein the wrist joint pulley is coupled to the drive section by a segmented transmission loop of separate band segments, and the wrist joint pulley has an end effector interface seating surface seated against the end effector that defines end effector level relative to the frame, and the end effector interface seating surface is at a level common with or below at least one of the separate band segments coupled to the pulley.

In accordance with one or more aspects of the disclosed embodiment a height of the at least one end effector is within a stack height profile of the wrist joint so that a total stack height of the at least one end effector and wrist joint is sized to conform with and pass through a pass-through of a slot valve.

In accordance with one or more aspects of the disclosed embodiment the stack height profile of the wrist joint includes the wrist joint pulley and SCARA arm extension extends the at least one end effector and at least part of the wrist joint pulley through the pass-through.

In accordance with one or more aspects of the disclosed embodiment at least one of the band segments has a height standing upright that spans across a level contact surface of the end effector that contacts and seats against a level surface of the interface seating surface of the wrist joint pulley forming part of the coupling between pulley and end effector.

In accordance with one or more aspects of the disclosed embodiment band anchor points joining each of the separate band segments to the wrist joint pulley are disposed so that at least one of the separate band segments wraps on the pulley so that a pulley perimeter edge, most proximate the end effector, and opposite the at least one separate band segment wrap, is disposed at or below a level of the wrap.

In accordance with one or more aspects of the disclosed embodiment the substrate processing apparatus further comprises another SCARA arm, mounted to the frame so that the shoulder axis is a common shoulder axis to both the SCARA arm and other SCARA arm.

In accordance with one or more aspects of the disclosed embodiment a method of processing a substrate in a substrate processing apparatus is provided. The method comprises the steps of:

providing the apparatus with a frame, a substrate transport apparatus coupled to the frame including a drive section, with at least one degree of freedom, and a SCARA arm, driven by the drive section, that is a two link arm plus an end effector that is pivotally coupled to a forearm, of the two link arm, by a wrist joint pulley configured so that an end effector level relative to the frame is set by the wrist joint pulley and SCARA arm extension and retraction effects end effector rotation, relative to the forearm, via a transmission loop of separate band segments joined to the wrist joint pulley; and transporting the substrate with the end effector by extending and retracting the SCARA arm with the at least one degree of freedom of the drive section;

wherein in transport one of the band segments wraps on the wrist joint pulley, and around and over a contact surface of the end effector seated against a seating surface of the wrist joint pulley setting the end effector level relative to the frame.

In accordance with one or more aspects of the disclosed embodiment the method further comprises moving the end effector in along a Z axis, with another degree of freedom of the drive section, to a substrate transport plane defined by a slot valve pass-through connected to the frame, and wherein transporting the substrate comprises moving the end effector along the substrate transport plane so that the end effector and at least part of the wrist joint pulley pass through the slot valve pass-through.

In accordance with one or more aspects of the disclosed embodiment a method is provided. The method including:

providing a frame of a substrate processing apparatus;

providing a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm and coupled to a wrist joint pulley so as to rotate relative to the forearm about a wrist joint axis;

providing a drive section with at least one degree of freedom operably coupled via a transmission to the SCARA arm to rotate the SCARA arm about a shoulder axis at the shoulder joint and to articulate the SCARA arm in extension and retraction; and effecting rotation, relative to the forearm, of the wrist joint pulley and the coupled at least one end effector together as a unit about the wrist joint axis upon extension and retraction of the SCARA arm, wherein a height of the at least one end effector is within a stack height profile of the wrist joint so that a total stack height of the at least one end effector and wrist joint is sized to conform with and pass through a pass-through of a slot valve.

In accordance with one or more aspects of the disclosed embodiment the stack height profile of the wrist joint includes the wrist joint pulley and SCARA arm extension extends the at least one end effector and at least part of the wrist joint pulley through the pass through of the slot valve.

In accordance with one or more aspects of the disclosed embodiment the method further including effecting rotation of the wrist joint pulley with a segmented transmission loop of separate band segments coupled to the wrist joint pulley, at least one of the band segments has a height spanning upright across a level contact surface of the end effector that contacts and seats against a level surface of the wrist joint pulley forming part of the coupling between pulley and end effector.

In accordance with one or more aspects of the disclosed embodiment the method further including providing another SCARA arm, mounted to the frame so that the shoulder axis is a common shoulder axis to both the SCARA arm and other SCARA arm.

In accordance with one or more aspects of the disclosed embodiment the other SCARA arm has another end effector at another wrist joint and wherein the other end effector and other wrist joint define another stack height profile with a total stack height sized to conform with and pass through the pass-through of the slot valve.

In accordance with one or more aspects of the disclosed embodiment the SCARA arm and the other SCARA arm are configured so that the at least one end effector and the other end effector respectively define different transfer planes stacked over each other.

In accordance with one or more aspects of the disclosed embodiment the method further including generating with a Z axis drive of the drive section operably connected to at least one of the SCARA arm and the other SCARA arm, Z axis travel of one or more of the at least one end effector and the other end effector based on a gap between a respective total stack height of a respective stack height profile and the pass-through.

In accordance with one or more aspects of the disclosed embodiment the wrist joint pulley is coupled to the drive section by a segmented transmission loop of separate band segments, at least one separate band segment is disposed proximate a level edge of the wrist joint pulley adjacent the at least one end effector, and projects out towards the at least one end effector from a level seating surface of the at least one end effector seated against the wrist joint pulley.

In accordance with one or more aspects of the disclosed embodiment band anchor points joining each of the separate band segments to the wrist joint pulley are disposed so that at least one of the separate band segments wraps on the pulley so that a pulley perimeter edge, most proximate the at least one end effector, and opposite the at least one separate band segment wrap, is disposed at or below a level of the wrap.

In accordance with one or more aspects of the disclosed embodiment the wrist joint pulley has an end effector interface seating surface seated against the at least one end effector that defines end effector level relative to the frame, and the end effector interface seating surface is at a level common with or below at least one of the separate band segments coupled to the wrist joint pulley.

In accordance with one or more aspects of the disclosed embodiment a substrate processing apparatus is provided. The substrate processing apparatus including:

a frame; and a substrate transport apparatus coupled to the frame including a drive section, with at least one degree of freedom, and a SCARA arm, driven by the drive section, that is a two link arm plus an end effector that is pivotally coupled to a forearm, of the two link arm, by a wrist joint pulley configured so that an end effector level relative to the frame is set by the wrist joint pulley and SCARA arm extension and retraction effects end effector rotation, relative to the forearm, via a transmission loop of separate band segments joined to the wrist joint pulley, and wherein the end effector is configured to transport the substrate by extending and retracting the SCARA arm with the at least one degree of freedom of the drive section, and wherein in transport one of the band segments wraps on the wrist joint pulley, and around and over a contact surface of the end effector seated against a seating surface of the wrist joint pulley setting the end effector level relative to the frame.

In accordance with one or more aspects of the disclosed embodiment another degree of freedom of the drive section moves the end effector along a Z axis to a substrate transport plane defined by a slot valve pass-through connected to the frame, and wherein the end effector transports the substrate along the substrate transport plane so that the end effector and at least part of the wrist joint pulley pass through the slot valve pass-through.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the invention.

What is claimed is:

1. A substrate processing apparatus comprising:
a frame;
a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm to rotate relative to the forearm about a wrist joint axis; and
a drive section with at least one degree of freedom operably coupled via a transmission to the SCARA arm to rotate the SCARA arm about a shoulder axis at the shoulder joint and to articulate the SCARA arm in extension and retraction;
wherein the at least one end effector is coupled to a wrist joint pulley so that at least a height portion of the at least one end effector overlaps at least a height portion of the wrist joint pulley, the wrist joint pulley is configured so that SCARA arm extension and retraction effects rotation, relative to the forearm, of the wrist joint pulley and the coupled at least one end effector together as a unit about the wrist joint axis; and
wherein a height of the at least one end effector is within a stack height profile of the wrist joint so that a total stack height of the at least one end effector and wrist joint is sized to conform with and pass through a pass-through of a slot valve.

2. The substrate processing apparatus of claim 1, wherein the stack height profile of the wrist joint includes the wrist joint pulley and SCARA arm extension extends the at least one end effector and at least part of the wrist joint pulley through the pass-through of the slot valve.

3. The substrate processing apparatus of claim 1, further comprising a segmented transmission loop of separate band segments coupled to the wrist joint pulley effecting rotation of the wrist joint pulley, at least one of the band segments has a height spanning upright across a level contact surface of the end effector that contacts and seats against a level surface of the wrist joint pulley forming part of the coupling between pulley and end effector.

4. The substrate processing apparatus of claim 1, further comprising another SCARA arm, mounted to the frame so that the shoulder axis is a common shoulder axis to both the SCARA arm and other SCARA arm.

5. The substrate processing apparatus of claim 4, wherein the other SCARA arm has another end effector at another wrist joint and wherein the other end effector and other wrist joint define another stack height profile with a total stack height sized to conform with and pass through the pass-through of the slot valve.

6. The substrate processing apparatus of claim 5, wherein the SCARA arm and the other SCARA arm are configured so that the at least one end effector and the other end effector respectively define different transfer planes stacked over each other.

7. The substrate processing apparatus of claim 5, wherein the drive section includes a Z axis drive operably connected to at least one of the SCARA arm and the other SCARA arm, and the Z axis drive generates Z axis travel of one or more of the at least one end effector and the other end effector based on a gap between a respective total stack height of a respective stack height profile and the pass-through.

8. The substrate processing apparatus of claim 1, wherein the wrist joint pulley is coupled to the drive section by a segmented transmission loop of separate band segments, at least one separate band segment is disposed proximate a level edge of the wrist joint pulley adjacent the at least one end effector, and projects out towards the at least one end effector from a level seating surface of the at least one end effector seated against the wrist joint pulley.

9. The substrate processing apparatus of claim 8, wherein band anchor points joining each of the separate band segments to the wrist joint pulley are disposed so that at least one of the separate band segments wraps on the pulley so that a pulley perimeter edge, most proximate the at least one end effector, and opposite the at least one separate band segment wrap, is disposed at or below a level of the wrap.

10. The substrate processing apparatus of claim 8, wherein the wrist joint pulley has an end effector interface seating surface seated against the at least one end effector that defines end effector level relative to the frame, and the end effector interface seating surface is at a level common with or below at least one of the separate band segments coupled to the wrist joint pulley.

11. A substrate processing apparatus comprising:
a frame;
a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm to rotate relative to the forearm about a wrist joint axis; and
a drive section with at least one degree of freedom operably coupled via a transmission to the SCARA arm to rotate the SCARA arm about a shoulder axis at the shoulder joint and to articulate the SCARA arm in extension and retraction;

wherein at least one end effector is coupled to a wrist joint pulley configured so that SCARA arm extension and retraction effects rotation, relative to the forearm, of the wrist joint pulley and the coupled at least one end effector together as a unit about the wrist joint axis; and wherein the wrist joint pulley is coupled to the drive section by a segmented transmission loop of separate band segments, and the wrist joint pulley has an end effector interface seating surface seated against the end effector that defines end effector level relative to the frame, and the end effector interface seating surface is recessed into the wrist joint pulley at a level common with or below at least one of the separate band segments coupled to the wrist joint pulley.

12. The substrate processing apparatus of claim 11, wherein a height of the at least one end effector is within a stack height profile of the wrist joint so that a total stack height of the at least one end effector and wrist joint is sized to conform with and pass through a pass-through of a slot valve.

13. The substrate processing apparatus of claim 12, wherein the stack height profile of the wrist joint includes the wrist joint pulley and SCARA arm extension extends the at least one end effector and at least part of the wrist joint pulley through the pass-through.

14. The substrate processing apparatus of claim 11, wherein at least one of the band segments has a height standing upright that spans across a level contact surface of the end effector that contacts and seats against a level surface of the interface seating surface of the wrist joint pulley forming part of the coupling between pulley and end effector.

15. The substrate processing apparatus of claim 11, wherein band anchor points joining each of the separate band segments to the wrist joint pulley are disposed so that at least one of the separate band segments wraps on the pulley so that a pulley perimeter edge, most proximate the end effector, and opposite the at least one separate band segment wrap, is disposed at or below a level of the wrap.

16. The substrate processing apparatus of claim 11, further comprising another SCARA arm, mounted to the frame so that the shoulder axis is a common shoulder axis to both the SCARA arm and other SCARA arm.

17. A method of processing a substrate in a substrate processing apparatus, the method comprising the steps of:
providing the substrate processing apparatus with a frame, a substrate transport apparatus coupled to the frame including a drive section, with at least one degree of freedom, and a SCARA arm, driven by the drive section, that is a two link arm plus an end effector that is pivotally coupled to a forearm, of the two link arm, by a wrist joint pulley configured so that an end effector level relative to the frame is set by the wrist joint pulley and SCARA arm extension and retraction effects end effector rotation, relative to the forearm, via a transmission loop of separate band segments joined to the wrist joint pulley; and
transporting the substrate with the end effector by extending and retracting the SCARA arm with the at least one degree of freedom of the drive section;
wherein in transport one of the band segments wraps on the wrist joint pulley, and around crossing over and above a contact surface of the end effector seated against a seating surface of the wrist joint pulley setting the end effector level relative to the frame.

18. The method of claim 17, further comprising moving the end effector in along a Z axis, with another degree of freedom of the drive section, to a substrate transport plane defined by a slot valve pass-through connected to the frame, and wherein transporting the substrate comprises moving the end effector along the substrate transport plane so that the end effector and at least part of the wrist joint pulley pass through the slot valve pass-through.

19. A method comprising:
providing a frame of a substrate processing apparatus;
providing a SCARA arm pivotally mounted to the frame at a shoulder joint of the SCARA arm, the SCARA arm being a two link arm with at least one end effector dependent therefrom, the two link arm defining an upper arm, including and determining the shoulder joint at one end, and a forearm pivotally joined to the upper arm so as to define an elbow joint of the SCARA arm, each of the at least one end effector being pivotally joined to the forearm at a wrist joint of the SCARA arm and coupled to a wrist joint pulley so as to rotate relative to the forearm about a wrist joint axis;
providing a drive section with at least one degree of freedom operably coupled via a transmission to the SCARA arm to rotate the SCARA arm about a shoulder axis at the shoulder joint and to articulate the SCARA arm in extension and retraction; and
effecting rotation, relative to the forearm, of the wrist joint pulley and the coupled at least one end effector together as a unit about the wrist joint axis upon extension and retraction of the SCARA arm,
wherein at least a height portion of the at least one end effector overlaps at least a height portion of the wrist joint pulley and a height of the at least one end effector is within a stack height profile of the wrist joint so that a total stack height of the at least one end effector and wrist joint is sized to conform with and pass through a pass-through of a slot valve.

20. The method of claim 19, wherein the stack height profile of the wrist joint includes the wrist joint pulley and SCARA arm extension extends the at least one end effector and at least part of the wrist joint pulley through the pass through of the slot valve.

21. The method of claim 19, further comprising effecting rotation of the wrist joint pulley with a segmented transmission loop of separate band segments coupled to the wrist joint pulley, at least one of the band segments has a height spanning upright across a level contact surface of the end effector that contacts and seats against a level surface of the wrist joint pulley forming part of the coupling between pulley and end effector.

22. The method of claim 19, further comprising providing another SCARA arm, mounted to the frame so that the shoulder axis is a common shoulder axis to both the SCARA arm and other SCARA arm.

23. The method of claim 22, wherein the other SCARA arm has another end effector at another wrist joint and wherein the other end effector and other wrist joint define another stack height profile with a total stack height sized to conform with and pass through the pass-through of the slot valve.

24. The method of claim 23, wherein the SCARA arm and the other SCARA arm are configured so that the at least one end effector and the other end effector respectively define different transfer planes stacked over each other.

25. The method of claim 23, further comprising generating with a Z axis drive of the drive section operably connected to at least one of the SCARA arm and the other SCARA arm, Z axis travel of one or more of the at least one end effector and the other end effector based on a gap between a respective total stack height of a respective stack height profile and the pass-through.

26. The method of claim 19, wherein the wrist joint pulley is coupled to the drive section by a segmented transmission loop of separate band segments, at least one separate band segment is disposed proximate a level edge of the wrist joint pulley adjacent the at least one end effector, and projects out towards the at least one end effector from a level seating surface of the at least one end effector seated against the wrist joint pulley.

27. The method of claim 26, wherein band anchor points joining each of the separate band segments to the wrist joint pulley are disposed so that at least one of the separate band segments wraps on the pulley so that a pulley perimeter edge, most proximate the at least one end effector, and opposite the at least one separate band segment wrap, is disposed at or below a level of the wrap.

28. The method of claim 26, wherein the wrist joint pulley has an end effector interface seating surface seated against the at least one end effector that defines end effector level relative to the frame, and the end effector interface seating surface is at a level common with or below at least one of the separate band segments coupled to the wrist joint pulley.

29. A substrate processing apparatus comprising:
a frame; and
a substrate transport apparatus coupled to the frame including
a drive section, with at least one degree of freedom, and
a SCARA arm, driven by the drive section, that is a two link arm plus an end effector that is pivotally coupled to a forearm, of the two link arm, by a wrist joint pulley configured so that an end effector level relative to the frame is set by the wrist joint pulley and SCARA arm extension and retraction effects end effector rotation, relative to the forearm, via a transmission loop of separate band segments joined to the wrist joint pulley, and
wherein the end effector is configured to transport the substrate by extending and retracting the SCARA arm with the at least one degree of freedom of the drive section, and
wherein in transport one of the band segments wraps on the wrist joint pulley, and around crossing over and above a contact surface of the end effector seated against a seating surface of the wrist joint pulley setting the end effector level relative to the frame.

30. The substrate processing apparatus of claim 29, wherein another degree of freedom of the drive section moves the end effector along a Z axis to a substrate transport plane defined by a slot valve pass-through connected to the frame, and wherein the end effector transports the substrate along the substrate transport plane so that the end effector and at least part of the wrist joint pulley pass through the slot valve pass-through.

* * * * *